United States Patent
Hirai et al.

(10) Patent No.: US 7,018,872 B2
(45) Date of Patent: Mar. 28, 2006

(54) ORGANIC THIN-FILM TRANSISTOR, ORGANIC THIN-FILM TRANSISTOR SHEET AND MANUFACTURING METHOD THEREOF

(75) Inventors: Katsura Hirai, Hachioji (JP); Shigehiro Kitamura, Hachioji (JP)

(73) Assignee: Konica Corporation, (JP)

(*) Notice: Subject to any disclaimer, the term of this patent is extended or adjusted under 35 U.S.C. 154(b) by 109 days.

(21) Appl. No.: 10/428,479

(22) Filed: May 2, 2003

(65) Prior Publication Data

US 2003/0211649 A1    Nov. 13, 2003

(30) Foreign Application Priority Data

May 9, 2002    (JP)    ............................. 2002-134056
Jun. 5, 2002    (JP)    ............................. 2002-164161
Oct. 22, 2002    (JP)    ............................. 2002-306861

(51) Int. Cl.
*H01L 21/00* (2006.01)
*H01L 21/84* (2006.01)

(52) U.S. Cl. ...................... 438/149; 438/158
(58) Field of Classification Search ................ 257/72, 257/E51.005, E29.159, 59; 438/149, 150, 438/151, 158, 163; 349/42, 43, 110
See application file for complete search history.

(56) References Cited

U.S. PATENT DOCUMENTS

| | | | | |
|---|---|---|---|---|
| 3,740,523 A | * | 6/1973 | Cohen et al. | ........... 219/121.69 |
| 5,958,288 A | * | 9/1999 | Mueller et al. | ........... 252/186.1 |
| 6,337,284 B1 | * | 1/2002 | Hwang et al. | ............... 438/710 |
| 6,514,801 B1 | * | 2/2003 | Yudasaka et al. | ............ 438/151 |
| 2003/0102472 A1 | * | 6/2003 | Kelley et al. | .................. 257/40 |

* cited by examiner

*Primary Examiner*—Hoai Pham
*Assistant Examiner*—Dana Farahani
(74) *Attorney, Agent, or Firm*—Cantor Colburn LLP

(57) ABSTRACT

A method for manufacturing an organic thin-film transistor, comprising a substrate, a gate electrode, a gate insulation layer, an organic semiconductor layer, a source electrode and a drain electrode, is disclosed, wherein the method comprises the steps of forming the gate electrode on the substrate, forming the gate insulation layer on the substrate, forming the semiconductor layer on the substrate, applying a metal particle dispersion containing metal particles on the substrate, gate insulation layer or organic semiconductor layer to form an electrode precursor layer comprised of the metal particles, and heat-fusing the metal particles in the electrode precursor layer to form the source electrode and the drain electrode.

14 Claims, 13 Drawing Sheets

FIG. 5 ( a )
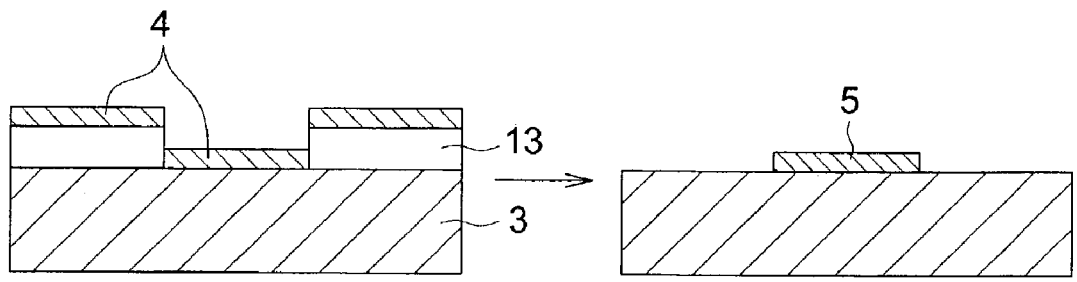
FIG. 5 ( b )
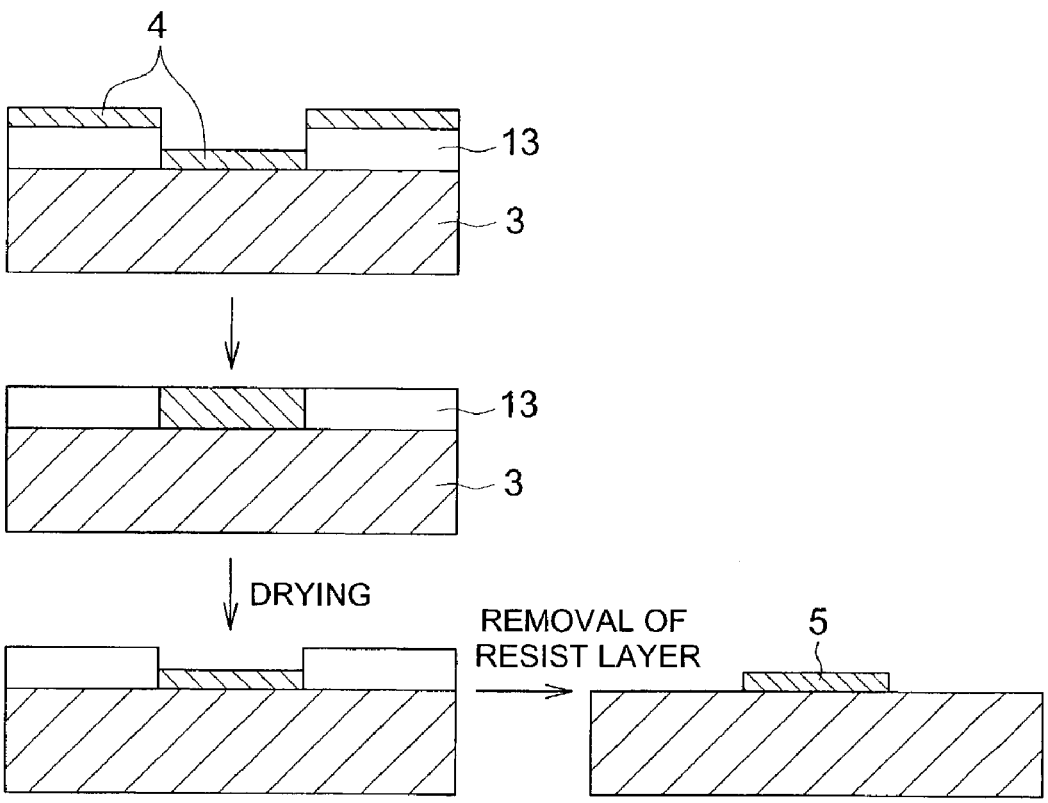

ORGANIC THIN-FILM TRANSISTOR, ORGANIC THIN-FILM TRANSISTOR SHEET AND MANUFACTURING METHOD THEREOF

FIELD OF THE INVENTION

The present invention relates to an organic thin-film transistor, an organic thin-film transistor sheet and a manufacturing method thereof, and particularly to an organic thin-film transistor and an organic thin-film transistor sheet each comprising a source or drain electrode formed from metal particles and a manufacturing method thereof.

BACKGROUND OF THE INVENTION

Application of an organic thin-film transistor (TFT) to a portable computer or a planar display has been developed. For example, in WO 01/47043, technique of manufacturing an organic thin-film transistor employing only polymer is disclosed, and a method of manufacturing a transistor employing a simple method such as an ink jet method or a coating method is proposed.

As an important step for manufacturing an organic TFT, there is a step of forming a channel pattern with high precision. In the patent described above, Japanese Patent O.P.I. Publication Nos. 10-190001 and 2000-307172, a gold layer formed according to a vacuum deposition method is subjected to patterning employing photolithography to form a channel portion. However, the above technique comprises a deposition process under vacuum and complex manufacturing steps, and needs an expensive manufacturing facility, resulting in cost increase.

In WO 01/47043 and WO 00/79617 is disclosed a method of forming an electrically conductive polymer pattern employing an ink jet method. However, this method has problem in that the electrically conductive polymer has high electric resistance, and does not provide high electric current.

In Japanese Patent O.P.I. Publication Nos. 2000-239853 are disclosed a method, which coats a metal particle dispersion on a substrate and heat-fuses the metal particles to form a metal film on the substrate, and a method, in which patterning is carried out employing a screen printing method. However, in this patent there is no disclosure regarding manufacture of an organic thin-film transistor.

SUMMARY OF THE INVENTION

The present invention has been made in view of the above. An object of the invention is to provide a manufacturing method of an organic thin-film transistor comprising a step of easily and precisely carrying out patterning employing a metal particle dispersion to easily form a source electrode and a drain electrode with high precision. Another object of the invention is to provide an inexpensive organic thin-film transistor.

BRIEF EXPLANATION OF THE DRAWINGS

FIGS. 5(a) and 5(b) show a method of forming a metal particle dispersion layer in the form of electrode through a resist.

DETAILED DESCRIPTION OF THE INVENTION

Figure 1:
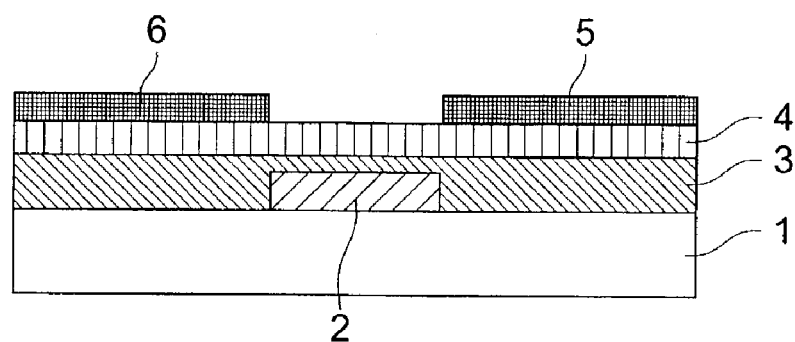
FIG. 1 is an example of the organic thin-film transistor manufactured according to the method of the invention.

The above object of the invention can be attained by the following constitution:

1-1. A method for manufacturing an organic thin-film transistor comprising a substrate, a gate electrode, a gate insulation layer, an organic semiconductor layer, a source electrode and a drain electrode, wherein the method comprises the steps of forming the gate electrode on the substrate, forming the gate insulation layer on the substrate, forming the organic semiconductor layer on the substrate, applying a metal particle dispersion containing metal particles on the substrate, gate insulation layer, or organic semiconductor layer to form an electrode precursor layer comprised of the metal particles, and heat-fusing the metal particles in the electrode precursor layer to form the source electrode and the drain electrode.

1-2. The method of item 1-1 above, wherein the metal particle dispersion containing metal particles is applied in an electrode pattern to form an electrode-shaped precursor layer comprised of the metal particles.

1-3. The method of item 1-2 above, wherein the metal particle dispersion containing metal particles is applied in an electrode pattern according to a method selected from the group consisting of a printing method, an ink jet method, an ablation method, a lift-off method, a squeegee method, and photolithography.

1-4. The method of item 1-3 above, wherein the photolithography comprises the steps of forming an electrode precursor layer comprised of metal particles on the gate insulation layer, forming a photoresist layer on the precursor layer, exposing the photoresist layer, and developing the exposed photoresist layer to leave the electrode-shaped precursor layer.

1-5. The method of item 1-1 above, wherein the metal particle dispersion is an aqueous metal particle dispersion.

1-6. The method of item 1-1 above, wherein the metal particles of the electrode precursor layer have an average particle diameter of not more than 100 nm.

1-7. The method of item 1-6 above, wherein the metal particles of the electrode precursor layer have an average particle diameter of not more than 50 nm.

1-8. The method of item 1-1 above, wherein the heat-fusing is carried out at 50 to 350° C.

1-9. The method of item 1-1 above, wherein the heat-fusing is carried out at 100 to 300° C.

1-10. The method of item 1-1 above, wherein the heat fusing is carried out employing a thermal head.

1-11. The method of item 1-1 above, wherein the heat fusing is carried out employing light-heat conversion.

1-12. The method of item 1-11 above, wherein the light-heat conversion is carried out employing a high luminance light.

1-13. The method of item 1-12 above, wherein the high luminance light is a laser.

1-14. The method of item 1-11 above, wherein the light-heat conversion is carried out through a light-heat conversion layer.

1-15. The method of item 1-1 above, wherein the metal particle dispersion applying step comprises applying two metal particle dispersions, one metal particle dispersion of the two containing first metal particles and the other containing second metal particles different from the first metal particles.

1-16. The method of item 1-1 above, further comprising the step of applying a dispersion containing an electrically conductive polymer on the semiconductor layer to form an electrically conductive polymer layer, wherein the electrode precursor layer is formed onto the resulting polymer layer.

1-17. An organic thin-film transistor comprising a substrate, a gate electrode, a gate insulation layer, an organic semiconductor layer, a source electrode and a drain electrode, wherein the organic thin-film transistor is manufactured by a method comprising the steps of forming the gate electrode on the substrate, forming the gate insulation layer on the substrate, forming the organic semiconductor layer on the substrate, applying a metal particle dispersion containing metal particles on the substrate, gate insulation layer, or organic semiconductor layer to form an electrode precursor layer comprised of the metal particles, and heat-fusing the metal particles in the electrode precursor layer to form the source electrode and the drain electrode.

1-18. The organic thin-film transistor of item 1-17 above, wherein the metal particle dispersion containing metal particles is applied in an electrode pattern to form an electrode-shaped precursor layer comprised of the metal particles.

1-19. The organic thin-film transistor of item 1-18 above, wherein the metal particle dispersion containing metal particles is applied in an electrode pattern according to a method selected from the group consisting of a printing method, an ink jet method, an ablation method, a lift-off method, a squeegee method, and photolithography.

1-20. The organic thin-film transistor of item 1-19 above, wherein the photolithography comprises the steps of forming an electrode precursor layer comprised of metal particles on the gate insulation layer, forming a photoresist layer on the precursor layer, exposing the photoresist layer, and developing the exposed photoresist layer to leave the electrode-shaped precursor layer.

1-21. The organic thin-film transistor of item 1-17 above, wherein the metal particle dispersion is an aqueous metal particle dispersion.

1-22. The organic thin-film transistor of item 1-17 above, wherein the metal particles of the electrode precursor layer have an average particle diameter of not more than 100 nm.

1-23. The organic thin-film transistor of item 1-22 above, wherein the metal particles of the electrode precursor layer have an average particle diameter of not more than 50 nm.

1-24. The organic thin-film transistor of item 1-17 above, wherein the heat-fusing is carried out at 50 to 350° C.

1-25. The organic thin-film transistor of item 1-24 above, wherein the heat-fusing is carried out at 100 to 300° C.

1-26. The organic thin-film transistor of item 1-17 above, wherein the heat fusing is carried out employing a thermal head.

1-27. The organic thin-film transistor of item 1-17 above, wherein the heat fusing is carried out employing light-heat conversion.

1-28. The organic thin-film transistor of item 1-27 above, wherein the light-heat conversion is carried out employing a high luminance light.

1-29. The organic thin-film transistor of item 1-28 above, wherein the high luminance light is a laser.

1-30. The organic thin-film transistor of item 1-27 above, wherein the light-heat conversion is carried out through a light-heat conversion layer.

1-31. The organic thin-film transistor of item 1-17 above, wherein the metal particle dispersion applying step comprises applying two metal particle dispersions, one metal particle dispersion of the two containing first metal particles and the other containing second metal particles different from the first metal particles.

1-32. The organic thin-film transistor of item 1-17 above, wherein the method further comprises the step of applying a dispersion containing an electrically conductive polymer on the semiconductor layer to form an electrically conductive polymer layer, and wherein the electrode precursor layer is formed onto the resulting polymer layer.

2-1. A method for manufacturing an organic thin-film transistor comprising a source electrode and a drain electrode, the method comprising the steps of providing a metal particle dispersion containing metal particles with an average particle diameter of not more than 50 nm, and heat fusing the metal particles by heating to form the source electrode and a drain electrode.

2-2. The method of item 2-1 above, wherein the metal particles are heat fused after an organic semiconductor layer has been formed.

2-3. The method of item 2-1 or 2-2 above, wherein the metal particles are provided in the form of electrode according to a printing method, and then heat fused.

2-4. The method of item 2-1 or 2-2 above, wherein the metal particles are provided in the form of electrode according to an ink jet method, and then heat fused.

2-5. The method of item 2-1 or 2-2 above, comprising the steps of forming a layer of the metal particle dispersion, and heat fusing the metal particles of the layer to give an electrode pattern.

2-6. The method of item 2-5 above, wherein the heat fusing is carried out employing a thermal head.

2-7. The method of item 2-5 above, wherein the heat fusing is carried out employing a light-heat conversion method.

2-8. The method of item 2-7 above, wherein the light-heat conversion method is carried out employing light with high luminance.

2-9. The method of item 2-7 above, wherein the light with high luminance is a laser.

2-10. The method of any one of items 2-7 through 2-9 above, wherein the light-heat conversion method is carried out through a light-heat conversion layer.

2-11. The method of item 2-1 or 2-2 above, comprising the steps of forming a layer of the metal particle dispersion, subjecting the layer to ablation to form an electrode-shaped layer, and heat fusing the metal particles in the resulting electrode-shaped layer.

2-12. The method of item 2-1 or 2-2 above, comprising the steps of forming a layer of the metal particle dispersion, forming a photoresist layer on the metal particle layer, exposing the photoresist layer, and subjecting the exposed photoresist layer to development to form an electrode-shaped metal particle layer, the development removing the metal particle layer at portions where the photoresist layer is removed.

2-13. The method of item 2-1 or 2-2 above, comprising the steps of forming a resist layer, then forming, on the resist layer, a metal particle dispersion layer of the metal particles, which are not dissolved nor dispersed in a solvent for the resist layer, and removing the resist layer to form an electrode-shaped metal particle dispersion layer.

2-14. The method of item 2-1 or 2-2 above, comprising the steps of forming a resist layer, then forming, on the resist layer, a metal particle dispersion layer containing the metal particles, which are not dissolved nor dispersed in a solvent for the resist layer, and squeegeeing the metal particle dispersion layer on the resist layer to form an electrode-shaped metal particle dispersion layer.

2-15. An organic thin-film transistor manufactured by the method of any one of items 2-1 through 2-14 above.

3-1. A method of manufacturing an organic thin-film transistor comprising the steps of forming a gate electrode on a substrate, forming a gate insulation layer on the gate electrode to cover the gate electrode, forming an organic semiconductor layer on the gate insulation layer, forming an electrode precursor layer on the organic semiconductor layer, the electrode precursor layer being capable of being removed with a developing solution, forming a light-sensitive resin layer on the electrode precursor layer, exposing the light-sensitive resin layer, and forming a source electrode and a drain electrode by developing the exposed light-sensitive resin layer with the developing solution, in which a part of the light-sensitive layer and a part of the electrode precursor layer are simultaneously removed.

3-2. The method of item 3-1 above, wherein the source electrode and the drain electrode are comprised of a metal particle dispersion layer.

3-3. The method of item 3-1 or 3-2 above, wherein after the step of forming the source electrode and the drain electrode, the method further comprises a heat treatment.

3-4. The method of any one of items 3-1 through 3-3 above, wherein the light-sensitive resin layer is sensitive to a laser.

3-5. The method of any one of items 3-1 through 3-4 above, wherein the light-sensitive resin layer is sensitive to an infrared laser.

3-6. The of any one of items 3-1 through 3-5 above, wherein the light-sensitive resin layer is a positive working light-sensitive resin layer.

3-7. The method of any one of items 3-1 through 3-6 above, wherein the gate insulation layer is comprised of an inorganic oxide and is formed according to an atmospheric pressure plasma method.

3-8. An organic thin-film transistor manufactured by the method of any one of items 3-1 through 3-7 above.

3-9. A method of manufacturing an organic thin-film transistor sheet comprising the steps of forming a gate electrode on a substrate, forming a gate insulation layer on the gate electrode to cover the gate electrode, forming an organic semiconductor layer on the gate insulation layer, forming an electrode precursor layer on the organic semiconductor layer, the electrode precursor layer being capable of being removed with a developing solution, forming a light-sensitive resin layer on the electrode precursor layer, exposing the light-sensitive resin layer, forming a source electrode and a drain electrode by developing the exposed light-sensitive resin layer with the developing solution, in which a part of the light-sensitive layer and a part of the electrode precursor layer are simultaneously removed, wherein a gate busline with the gate electrode is formed at the gate electrode forming step, and a source busline with the source electrode or the drain electrode and an input-output electrode with the source electrode or the drain electrode are formed at the source or drain electrode forming step to form plural organic thin-film transistors arranged in matrix state and connected to the gate busline and the source busline.

3-10. An organic thin-film transistor sheet manufactured by the method of item 3-9 above.

4-1. An organic thin-film transistor comprising a gate electrode, a gate insulation layer, an organic semiconductor layer adjacent to the gate insulation layer, a source electrode and a drain electrode, each of the source electrode and drain electrode contacting the organic semiconductor layer, wherein each of the source electrode and drain electrode is comprised of two layers, one layer of the two containing a first electrically conducting material and the other containing a first electrically conducting material different from the second electrically conducting material.

4-2. The organic thin-film transistor of item 4-1 above, wherein the first and second electrically conducting materials are different in work function, and the organic semiconductor layer contacts at least one layer containing a electrically conducting material having larger work function.

4-3. The organic thin-film transistor of item 4-1 or 4-2 above, wherein the organic semiconductor layer electrically connects both at least one layer of each of the source and drain electrodes, and is in contact with the gate insulation layer.

4-4. The organic thin-film transistor of item 4-3 above, wherein the organic semiconductor layer electrically connects both at least one layer of each of the source and drain electrodes, and is in contact with the gate insulation layer.

4-5. The organic thin-film transistor of item 4-3 or 4-4 above, wherein the organic semiconductor layer electrically connects both at least one layer of each of the source and drain electrodes, and is in contact with the gate insulation layer.

4-6. An organic thin-film transistor device arranging the organic thin-film transistor of any one of items 4-1 through 4-5 above in a matrix of a gate busline and a source busline, wherein a part of the source busline is a source electrode.

4-7. The organic thin-film transistor device of item 4-6 above, wherein a part of the gate busline is a gate electrode.

4-8. The organic thin-film transistor device of item 4-6 or 4-7 above, wherein the device further comprises a display electrode and a part of the display electrode is a drain electrode.

4-9. The organic thin-film transistor device of any one of items 4-6 through 4-8 above, wherein the device is formed on a polymer substrate.

4-10. A method of manufacturing the organic thin-film transistor of any one of items 4-1 through 4-5 above, the method comprising the steps of forming on a substrate a gate electrode, a gate insulation layer, an organic semiconductor layer, a source electrode and a drain electrode, wherein the method further comprises the steps of coating two electrode precursor layers containing different metal particles and a photoresist layer simultaneously or in that order, and etching the two electrode precursor layers according to photolithography to form the source electrode and the drain electrode each being comprised of the two layers.

4-11. The method of item 4-10, wherein the source electrode and the drain electrode are heat fused by heat treatment.

4-12. A method of manufacturing the organic thin-film transistor device of items 4-6, the method comprising the steps of forming on a substrate a gate electrode serving also as a gate busline, a gate insulation layer, an organic semiconductor layer, a source electrode serving also as a source busline and a drain electrode serving also as a display electrode, wherein the method further comprises the steps of coating two electrode precursor layers containing different metal particles and a photoresist layer simultaneously or in that order, and etching the two electrode precursor layers according to photolithography to form the source electrode and the drain electrode each being comprised of the two layers.

4-13. The method of item 4-12, wherein the source electrode and the drain electrode are heat fused by heat treatment.

FIG. 1 is an example of the organic thin-film transistor manufactured according to the method of the invention, but the present invention is not limited thereto.

Numerical number 1 represents a substrate, numerical number 2 represents a gate electrode, numerical number 3 represents a gate insulation layer which covers the gate electrode, numerical number 4 represents an organic semiconductor layer, numerical number 5 represents a source electrode, and numerical number 6 represents a drain electrode. The organic thin-film transistor of FIG. 1 is a bottom gate type field effect transistor (FET) in which the organic semiconductor layer 4 is an active layer.

A substrate 1 used in the organic thin-film transistor is comprised of glass or a flexible resin sheet. For example, it is possible to use a plastic film as the sheet. Examples of the plastic film include films comprised of, for example, polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of the plastic film makes it possible to decrease weight, to enhance portability, and to enhance durability against impact due to its flexibility, as compared to glass.

Materials for constituting the gate electrode 2 are not particularly restricted as long as they are electrically conductive materials. Employed as the materials are platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Of theses, specifically preferred are platinum, gold, silver, copper, aluminum, indium, and ITO.

Electrically conductive polymers known in the art are suitably employed, which include electrically conductive polyaniline, electrically conductive polypyrrole, electrically conductive polythiophene, and a complex of polyethylenedioxythiophene and polystyrene sulfonic acid, which increase electrical conductivity upon being doped. Materials for the source and drain electrodes are preferably those which provide a low electric resistance at the electrode surface contacting the organic semi-conductor layer.

Methods for forming the gate electrode 2 include a method in which a photolithographic method or a lift-off method, known in the art, is applied to an electrically conductive layer of the materials described above, which has been formed employing a vacuum deposition method or a sputtering method, and a method in which a resist layer is subjected to etching which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing to obtain an electrode. An electrode may also be formed in such a manner that a coated layer is subjected to lithography or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing.

Examples of the electrically conductive particles include particles with a particle size of 1 to 50 nm, and preferably 1 to 10 nm of metals such as platinum, gold, silver, copper, cobalt, chromium, iridium, nickel, palladium, molybdenum, and tungsten. Methods for preparing such metal particles include a physical preparation method such as a gas vaporization method, a sputtering method, or a metallic vapor preparation method and a chemical preparation method such as a colloid method or a co-precipitation method in which metal ions are reduced in a liquid phase to produce metal particles. The metal particles dispersion are preferably ones prepared according to a colloid method disclosed in Japanese Patent O.P.I. Publication Nos. 11-76800, 11-80647, 11-319538, and 2000-239853, or ones prepared according to a gas vaporization method disclosed in Japanese Patent O.P.I. Publication Nos. 2001-254185, 2001-53028, 2001-35814, 2001-35255, 2001-124157 and 2000-123634. These metal particle dispersions are coated, formed in an electrode pattern, dried, and further subjected to heat treatment at from 100 to 300° C., and preferably from 150 to 200° C., whereby the metal particles are heat-fused to form an electrode.

Various gate insulations may be employed as the gate insulation layer 3. The gate insulation layer is preferably an inorganic oxide layer comprised of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. An inorganic nitride such as silicon nitride or aluminum nitride can be also suitably used.

The methods for forming the above layer include a dry process such as a vacuum deposition method, a molecular beam epitaxial growth method, an ion cluster beam method, a low energy ion beam method, an ion plating method, a CVD method, a sputtering method, or an atmospheric pressure plasma method, a wet process such as a spray coating method, a spin coating method, a blade coating method, a dip coating method, a casting method, a roll coating method, an bar coating method, or a die coating method, and a patterning method such as a printing method or an ink-jet method. These methods can be used due to kinds of materials used in the gate insulation layer.

As the typical wet process can be used a method of coating a dispersion liquid and drying, the liquid being obtained by dispersing inorganic oxide particles in an organic solvent or water optionally in the presence of a dispersant such as a surfactant, or a so-called sol gel method of coating a solution of an oxide precursor such as an alkoxide and drying.

Among the above, the preferred are an atmospheric pressure plasma method and a sol gel method. A method of forming a gate insulation layer according to the plasma layer formation method at atmospheric pressure will be explained below.

The plasma layer formation method at atmospheric pressure means a method wherein a reactive gas is plasma-excited by discharge conducted at atmospheric pressure or at approximately atmospheric pressure, whereby a thin-film is formed on a substrate. The method (hereinafter referred to also as an atmospheric pressure plasma method) is described in Japanese Patent O.P.I. Publication Nos. 11-133205, 2000-185362, 11-61406, 2000-147209 and 2000-121804. This method can form a thin film having high performance at high productivity.

Examples of the organic compound used in an organic compound layer include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, and cyanoethylpullulan.

As a method of forming the organic compound layer, the wet process described above is preferably used.

The inorganic oxide layer and the organic compound layer can be used in combination and superposed. The thickness of the gate insulation layer is generally 50 nm to 3 μm, and preferably 100 nm to 1 μm.

Numerical number 4 is an organic semiconductor layer, and π conjugate compounds are used as organic semiconductive materials for the organic semiconductor layer 4. Examples of the π conjugate compounds include polypyrroles such as polypyrrole, poly(N-substituted pyrrole), poly (3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly (p-phenylenevinylene); polyanilines such as polyaniline, poly(N-substituted aniline), poly(3-substituted aniline), and poly(2,3-substituted aniline); polyacetylnenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide; and polycyclic condensation products described in Japanese Patent O.P.I. Publication No. 11-195790. Further, oligomers having repeating units in the same manner as in the above polymers, for example, thiophene hexamers including α-sexithiophene, α, ω-dihexyl-α-sexithiophene, α,ω-dihexyl-α-quiinquethiophene, and α,ω-bis(3-butoxypropyl)-α-sexithiophene, or styrylbenzene derivatives, can be suitably employed. Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tretracarboxylic acid diimide, N,N'-bis(1H,1H-perfluoroctyl)naphthalene 1,4,5,8-tetracarboxylic acid diimide derivatives, N,N'-bis (1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines.

Of these π conjugate compounds, preferably employed are at least one selected from the group consisting of oligomers, which have, as a repeating unit, a substituted or unsubstituted thienylene group, a substituted or unsubstituted vinylene group, a substituted or unsubstituted thienylenevinylene group, a substituted or unsubstituted phenylenevinylene group, a substituted or unsubstituted p-phenylene group or at least two kinds thereof, and have a repeating unit number of from 4 to 10; polymers which have the same repeating unit as above and a repeating unit number of at least 20; condensed polycyclic aromatic compounds such as pentacene; fullerenes; condensed cyclic compounds having a tetracarboxylic acid diimide group; of condensed ring compounds or metallo-phthalocyanines.

Further, employed as other materials for organic semiconductors may be organic molecular complexes such as a tetrathiafulvalene (TTF)-tetracyanoquinodimethane (TCNQ) complex, a bisethylenetetrathiafulvalene (BEDTTTF)-perchloric acid complex, a BEDTTTF-iodine complex, and a TCNQ-iodine complex. Still further, employed may be σ conjugated polymers such as polysilane and polygermane, as well as organic-inorganic composite materials described in Japanese Patent O.P.I. Publication No. 2000-260999.

In the invention, the organic semiconductor layer may be subjected to a so-called doping treatment (referred to also as simply doping) by incorporating in the layer, materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant. Employed as the dopant used in the present invention may be either acceptor or donor.

Examples of the acceptor include halogens such as $Cl_2$, $Br_2$, $I_2$, $ICl$, $ICl_3$, $IBr$, and $IF$; Lewis acids such as $PF_5$, $AsF_5$, $SbF_5$, $BF_3$, $BCl_3$, $BBr_3$, and $SO_3$; protonic acids such as HF, HCl, $HNO_3$, $H_2SO_4$, $HClO_4$, $FSO_3H$, $ClSO_3H$, and $CF_3SO_3H$; organic acids such as acetic acid, formic acid, and amino acid; transition metal compounds such as $FeCl_3$, $FeOCl$, $TiCl_4$, $ZrCl_4$, $HfCl_4$, $NbF_5$, $NbF_5$, $NbCl_5$, $TaCl_5$, $MoCl_5$, $WF_5$, $WCl_5$, $UF_6$, $LnCl_3$ (Ln=lanthanoid such as La, Ce, Nd, and Pr, and Y), and electrolyte anions such as $Cl^-$, $Br^-$, $I^-$, $ClO^{4-}$, $P^{6-}$, $AsF^{5-}$, $SbF^{6-}$, $BF^{4-}$, and a sulfonate anion.

Examples of the donor include alkali metals such as Li, Na, K, Rb, and Cs; alkaline earth metals such as Ca, Sr, and Ba; rare earth metals such as Y, La, Ce, Pr, Nd, Sm, Eu, Gd, Tb, Dy, Ho, Er, and Yb; an ammonium ion; $R_4P^+$, $R_4AS^+$, and $R_3S^+$; and acetylcholine.

Doping these dopants may be carried out employing either a method in which the dopants are incorporated into an organic semiconductor layer having been formed, or a method in which the dopants are incorporated into an organic semiconductor layer while the layer is formed. The former methods include a gas phase doping in which gaseous dopants are employed, a liquid phase doping in which doping is carried out while the layer is brought into contact with a dopant solution or a liquid dopant, and a solid phase doping in which diffusion doping is carried out while the layer is brought into contact with a solid dopant so that the dopant diffuse into the layer. In the liquid phase doping, it is possible to adjust the doping efficiency by means of electrolysis. In the latter method, a solution or a dispersion each containing an organic semiconductor material and a dopant may be coated and subsequently dried. For instance, when a vacuum deposition method is used, dopants may be incorporated in the layer by co-deposition of an organic semiconductor material and a dopant. Further, when the layer is formed employing a sputtering method, sputtering is carried out utilizing the two targets of an organic semiconductor material and a dopant, whereby the dopant can be incorporated in the layer. Still further, as other methods, it is possible to use any of chemical doping such as electrochemical doping or photoinitiation doping, or physical doping such as an ion injection method as shown in, for example, a publication "Kogyo Zairyo", Volume 34, No. 4, page 55 (1986).

The methods for forming the organic semiconductor layer include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, an bar coating method, a die coating method, and an LB method. These methods may be used according to kinds of materials used. However, of these, a spin coating method, a blade coating method, a dip coating method, a roll coating method, a bar coating method, and a die coating method are preferred from the viewpoint of productive efficiency. Further, they can simply and accurately form the layer employing a solution of organic semiconductor materials. The thickness of the organic semiconductor layer is not specifically limited. The thickness of an active layer comprised of the organic semiconductor materials often has a great influence on properties of the resultant transistor. Accordingly, the thickness of the layer differs due to kinds of the organic semiconductor materials used, but it is ordinarily not more than 1 μm, and preferably from 10 to 300 nm.

Numerical number 5 represents a source electrode, and numerical number 6 represents a drain electrode. These electrodes are formed applying a metal particle dispersion containing metal particles with an average particle size of not more than 100 nm, preferably 1 to 50 nm, and more preferably 1 to 10 nm, to form an electrode precursor layer, and heat fusing the metal particles of the electrode precursor layer. Examples of the metal include platinum, gold, silver, nickel, chromium, copper, iron, tin, antimony, lead, tantalum, indium, palladium, tellurium, rhenium, iridium, aluminum, ruthenium, germanium, molybdenum, tungsten, and zinc. The metals are preferably platinum, gold, silver, copper, cobalt, chromium, iridium, nickel, palladium, molybdenum, and tungsten, each of which has a work function of not less than 4.5 eV.

In the invention, the average particle size can be measured according to a known method, for example, a light scattering method such as a laser scattering method or a direct observation method employing SEM or TEM.

As the metal particle dispersion, a dispersion liquid such as paste or ink, in which the metal particles are dispersed in a liquid medium such as water, an organic solvent or a mixture thereof preferably in the presence of an organic dispersion stabilizer, is used. In the invention, as the metal particle dispersion, a metal particle aqueous dispersion is preferred. A dispersion medium used in the metal particle aqueous dispersion is water or a mixture of water and an organic solvent. Examples of the organic solvent include ethanol, propanol, benzyl alcohol, ethylene glycol, propylene glycol, acetone, MEK, cyclohexanone, propylene glycol monomethyl ether, propylene glycol monomethyl ether acetate, toluene, and xylene. The mixture of water and the organic solvent contains water in an amount of preferably not less than 50% by weight, and more preferably not less than 90% by weight. The dispersion medium may contain an additive such as an acid, an alkali, a dispersant or a surfactant.

Methods for preparing such a metal particle dispersion include a physical preparation method such as a gas vaporization method, a sputtering method, or a metallic vapor preparation method and a chemical preparation method such as a colloid method or a co-precipitation method in which metal ions are reduced in a liquid phase to produce metal particles. The metal particle dispersions are preferably ones prepared according to a colloid method disclosed in Japanese Patent O.P.I. Publication Nos. 11-76800, 11-80647, 11-319538, and 2000-239853, or ones prepared according to a gas vaporization method disclosed in Japanese Patent O.P.I. Publication Nos. 2001-254185, 2001-53028, 2001-35255, 2001-124157 and 2000-123634. A layer of these metal particle dispersions is formed according to procedures described later, dried, and further heated at 50 to 350° C., preferably 100 to 300° C., and more preferably 150° to 200° C., whereby metal particles are heat-fused to form an electrode.

In the invention, it is preferred that the metal particles of the metal particle dispersion layer are heat fused to form an electrode, after an organic semiconductor layer to connect the electrode has been formed. That is, simultaneous heating of the metal particles and the organic semiconductor layer leads to strong physical adhesion between them and reduced contact resistance, providing high electric current. Formation order of the metal particle dispersion layer and the organic semiconductor layer is not limited.

There are various electrode formation methods. For example, there are a first method in which a metal particle dispersion layer in an electrode pattern of the metal particles is applied and then heat fused to form an electrode, and a second method in which an electrode precursor layer of the metal particles is formed and then heat fused in an electrode pattern to form an electrode. As the first method, there is a printing method. The printing method is one in which the metal particle dispersion is used as ink, and the metal particle dispersion layer in an electrode pattern is printed. Examples of the printing method include letter press printing, or screen printing, lithographic printing, intaglio printing, and mimeograph printing.

Further, as the first method, there is an ink jet method. The ink jet method is one in which the metal particle dispersion is used as ink for ink jet, and the metal particle dispersion layer in an electrode pattern is formed by jetting the ink from an ink jet head. As the ink jetting process, there is a well-known method, for example, an on-demand ink-jet process such as a piezo method or a bubble-jet method, or a continuous ink-jet process such as a static suction method.

After the metal particle dispersion layer in an electrode pattern of the metal particles is applied, the metal particles of the resulting layer is heat fused to form a source electrode and a drain electrode.

Figure 2:
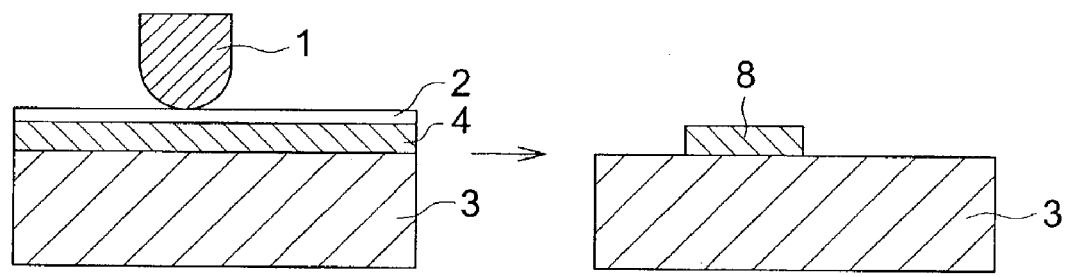
FIG. 2 shows a method of heat-fusing metal particles in the electrode form through a thermal head to form an electrode.

FIG. 2 shows a method of forming a metal particle dispersion layer over a base, and heat-fusing the metal particles of the resulting layer in an electrode pattern through a thermal head to form an electrode.

The term, "a base" hereinafter referred to means a base material on which the source electrode or the drain electrode is provided, and the base material may be a gate insulation layer or an organic semiconductor layer according to constitution of the organic thin-film transistor in the invention.

FIG. 2 shows a method which heat-fuses a metal particle dispersion layer 4 uniformly formed on a base 3, employing a thermal head 1 to form an electrode pattern, in which the metal particle dispersion layer at heat-fused portions forms a source or electrode 8. A protective film 2, which is shown in the figure, functions as a spacer to prevent the metal particle dispersion layer from sticking to the thermal head. The formed electrode can function as an electrode without removing the protective layer, but the protective layer at unheated portions is preferably removed. As a method of removing the layer at the unheated portions, there is a method in which the metal particle dispersion layer at unheated portions and the protective layer are simultaneously removed, or a method in which both the metal particle dispersion layer at unheated portions and the protective layer are removed, employing a solvent, water or an aqueous solution which optionally contains a surfactant, an organic solvent, an acid or an alkali. When the protective layer is peeled away, an adhesion layer may be provided so that the metal particle dispersion layer at unheated portions is peeled away with the protective layer.

FIGS. 3(a) through 3(d) show a method comprising forming a metal particle dispersion layer, and heat-fusing the metal particle dispersion layer in an electrode pattern, employing a light-heat conversion method, whereby an electrode is formed.

Figure 3:
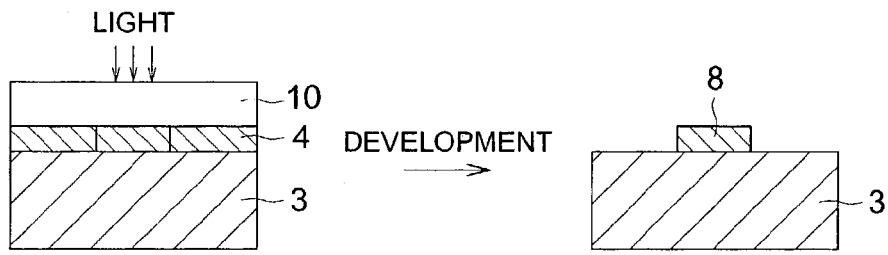
FIGS. 3(a) through 3(d) show a method of heat-fusing metal particles in the electrode form, employing a light-heat conversion method, whereby an electrode is formed.
Figure 3:
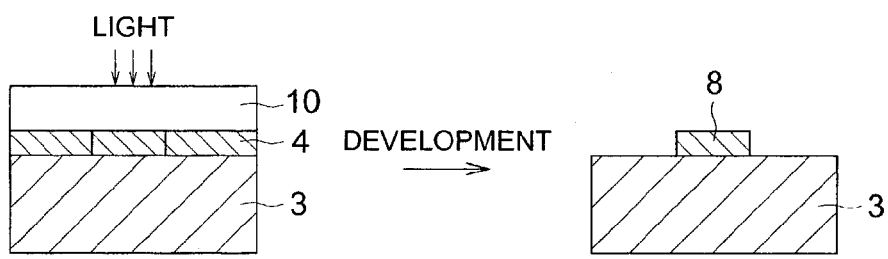
Figure 3:
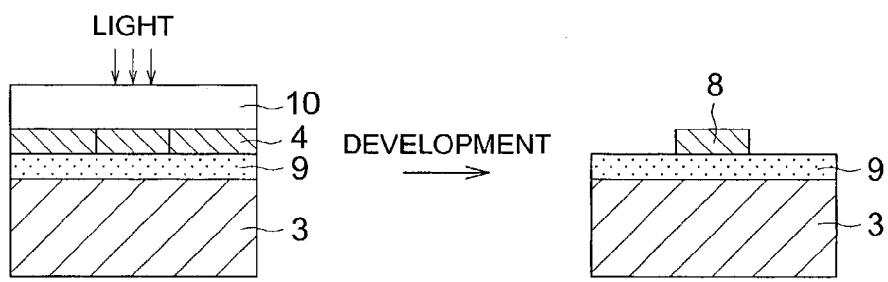
Figure 3:
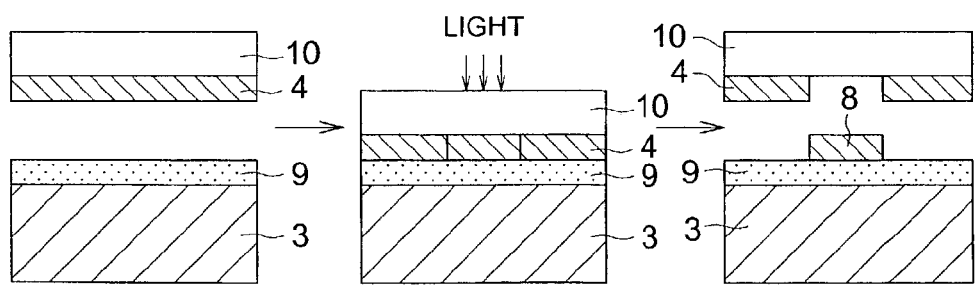

FIG. 3(a) shows a method comprising forming a metal particle dispersion layer 4 on a base 3, providing an anti-ablation layer 10 on the metal particle dispersion layer, and subjecting the metal particle dispersion layer to light-heat conversion to form an electrode pattern, employing a high illuminance light (for example, laser or infrared light) to heat-fuse the metal particles, whereby a source electrode or drain electrode 8 is formed. The source electrode or drain electrode each having the light-heat conversion layer can function as an electrode, but the light-heat conversion layer at unheated portions is preferably removed. Herein, when the anti-ablation layer 10 is peeled away, the metal particle dispersion layer at portions not heat-fused is peeled away with the anti-ablation layer.

FIG. 3(b) shows a method comprising forming a metal particle dispersion layer 4 on a base 3, providing an anti-ablation layer 10 comprised of a water-soluble resin on the metal particle dispersion layer, subjecting the metal particle dispersion layer to light-heat conversion to form an electrode pattern, employing a high illuminance light (for example, laser or infrared light) to heat-fuse the metal particles, whereby a source electrode or drain electrode 8 is formed, and removing the anti-ablation layer together with the metal particle layer at unheated portions, employing a solvent, water or an aqueous solution which optionally contains a surfactant, an organic solvent, an acid or an alkali.

FIG. 3(c) shows a method comprising forming a light-heat conversion layer 9 on a base 3, providing a metal particle dispersion layer 4 on the light-heat conversion layer, providing an anti-ablation layer 10 comprised of a water-soluble resin on the metal particle dispersion layer, heat-fusing the metal particle dispersion layer through the light-heat conversion employing a high illuminance light (for example, laser or infrared light) to form an electrode pattern, whereby a source electrode or drain electrode 8 is formed, and removing the anti-ablation layer together with the metal particle layer at unheated portions in the same manner as in FIG. 3(b).

FIG. 3(d) shows a method comprising providing a first material having a light-heat conversion layer 9 on a base 3, providing a second material having a metal particle dispersion layer 4 on an anti-ablation layer 10, bringing the first material into contact with the second material so that the light-heat conversion layer 9 faces the metal particle dispersion layer 4, heat-fusing the metal particle dispersion layer through the light-heat conversion employing a high illuminance light (for example, laser or infrared light) to form an electrode pattern, and peeling away the first material from the second material to form a source electrode or drain electrode 8 on the light-heat conversion layer 9.

FIGS. 4(a) through 4(e) show a method in which the metal particle dispersion layer in an electrode pattern is formed employing an ablation method.

Figure 4A:
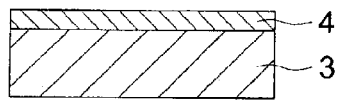
FIGS. 4(a) through 4(e) show a method in which a metal particle dispersion layer is subjected to patterning employing an ablation method to form an electrode-shaped metal particle dispersion layer.

FIG. 4(a) shows a metal particle dispersion layer 4 uniformly formed on a base 3.

Figure 4B:
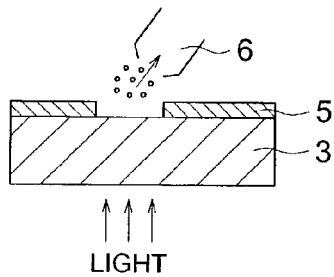

FIG. 4(b) shows a method comprising subjecting the metal particle dispersion layer to ablation by laser exposure from the base side, and sucking the decomposed products produced at exposed portions through a suction apparatus to form a metal particle dispersion layer 5 having a specific pattern. After that, the metal particles in the metal particle dispersion layer 5 are heat-fused to form a source electrode or a drain electrode.

Figure 4C:
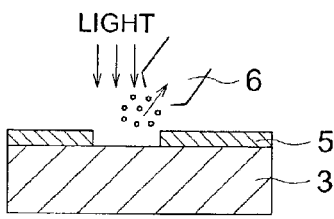

FIG. 4(c) shows a method comprising subjecting the metal particle dispersion layer to ablation by laser exposure from the metal particle dispersion layer side, and forming a source electrode or a drain electrode in the same manner as denoted in FIG. 4(b) above.

Figure 4D:
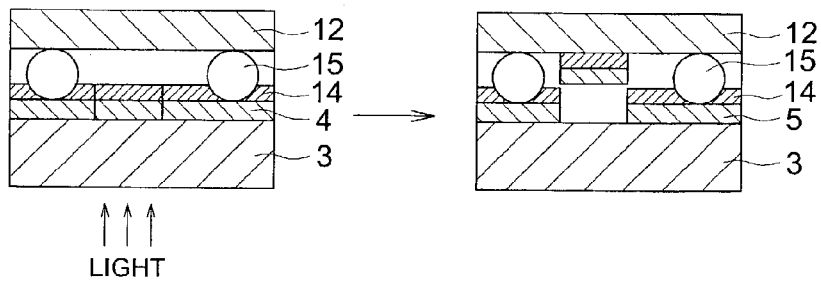

FIG. 4(d) shows a method in which ablation is carried out employing a peeling sheet. FIG. 3(d) shows a method comprising forming a metal particle dispersion layer 4 on a base 3, providing on the metal particle dispersion layer an overcoat layer 14 containing a matting agent 15 (particulate solids), providing on the overcoat layer a peeling sheet 12, in which a space is formed due to the matting agent 15 between the peeling sheet 12 and the overcoat layer 14, subjecting the resulting material to ablation by laser exposure from the base side, whereby the metal particle dispersion layer is transferred to the peeling sheet together with the overcoat layer, and peeling the peeling sheet 12 from the material to form a metal particle dispersion layer 5 having a specific pattern. After that, the metal particles in the layer 5 can be heat-fused to form a source electrode or a drain electrode. The peeling sheet peeled away from the material, having a metal particle dispersion layer to have been transferred, can be heat-fused to form a source electrode or a drain electrode.

Figure 4E:
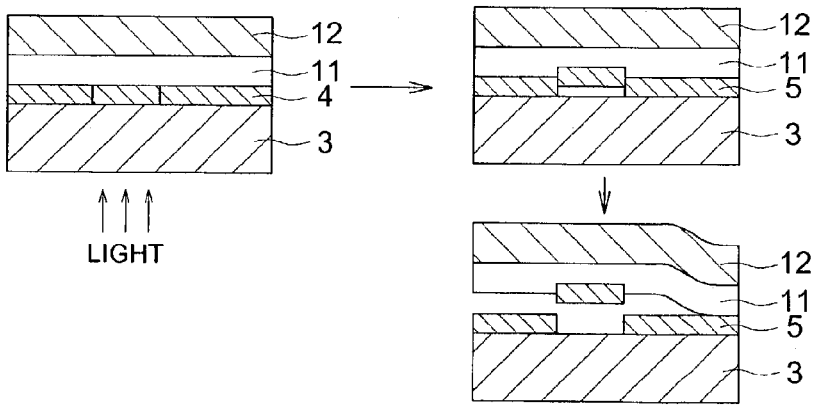

FIG. 4(e) shows a method comprising forming a metal particle dispersion layer 4 on a base 3, providing on the metal particle dispersion layer a peeling sheet 12 with a cushion layer 11, the cushion layer facing the metal particle dispersion layer, subjecting the resulting material to ablation by laser exposure from the base side, whereby the metal particle dispersion layer to have been ablated is adsorbed onto the cushion layer 11, and peeling away the peeling sheet 12 from the material to form a metal particle dispersion layer 5 having a specific pattern. After that, the metal particles in the layer 5 can be heat-fused to form a source electrode or a drain electrode. The peeling sheet peeled from the material having a metal particle dispersion layer to have been adsorbed can be heat-fused to form a source electrode or a drain electrode.

Light sources used in the ablation are not specifically restricted as long as they are light sources capable of causing ablation at the interface between a base and a metal particle dispersion layer. An electromagnetic wave capable of reducing an energy-applied area, particularly ultraviolet rays, visible rays and infrared rays having a wavelength ranging from 1 nm through 1 mm are preferable in obtaining high resolution. As a laser light source emitting such rays, a well-known solid laser such as a ruby laser, a YAG laser, or a glass laser; a gas laser such as a He—Ne laser, an Ar ion laser, a Kr ion laser, a $CO_2$ laser, a CO laser, a He—Cd laser, an $N_2$ laser or an excimer laser; a semiconductor laser such as an InGaP laser, an AlGaAs laser, a $CdSnP_2$ laser or a GaSb laser; a chemical laser and a dye laser are usable. Among them, the use of a semiconductive laser generating light having a wavelength of from 600 to 1200 nm is preferable in view of output power or stability.

The term "ablation" includes phenomena in which the metal particle dispersion layer is completely scattered or a part of the layer is destroyed and/or scattered by physical or chemical change, or physical or chemical change occurs only near the interface between the base and the layer.

To peel away the exposed sheet as described above, various methods, such as a fixed peeling angle method using a peeling blade or a peeling roller and a hand peeling method without fixing the peeling sheet or the base, can be applied as long as they have no influence on the formed electrode.

FIGS. 5(a) and 5(b) show a method of forming a resist and defining an electrode pattern in the metal particle dispersion layer through the resist.

FIG. 5(a) shows a lift-off method comprising forming a resist 13 on a base 3, coating a metal particle dispersion layer 4 on the surface of the base on the resist side, and then removing the resist wherein the metal particle dispersion layer on the resist is simultaneously removed, to form a metal particle dispersion layer 5 having a specific (electrode) pattern.

FIG. 5(b) shows a squeegee method comprising forming a resist 13 on a base 3, coating a metal particle dispersion layer 4 on the surface of the base on the resist side, removing the metal particle dispersion layer on the resist with a squeegee (for example, a blade or a squeegee roller) to leave a metal particle dispersion layer having a specific (electrode) pattern, drying the resulting material, and then removing the resist to form a metal particle dispersion layer 5 having a specific (electrode) pattern.

In FIGS. 5(a) and 5(b), the metal particles in the metal particle dispersion layer 5 can be heat-fused to form a source electrode or a drain electrode. Further, in FIGS. 5(a) and 5(b), the metal particles in the metal particle dispersion layer 4 can be heat-fused before removing the resist.

Figure 6:
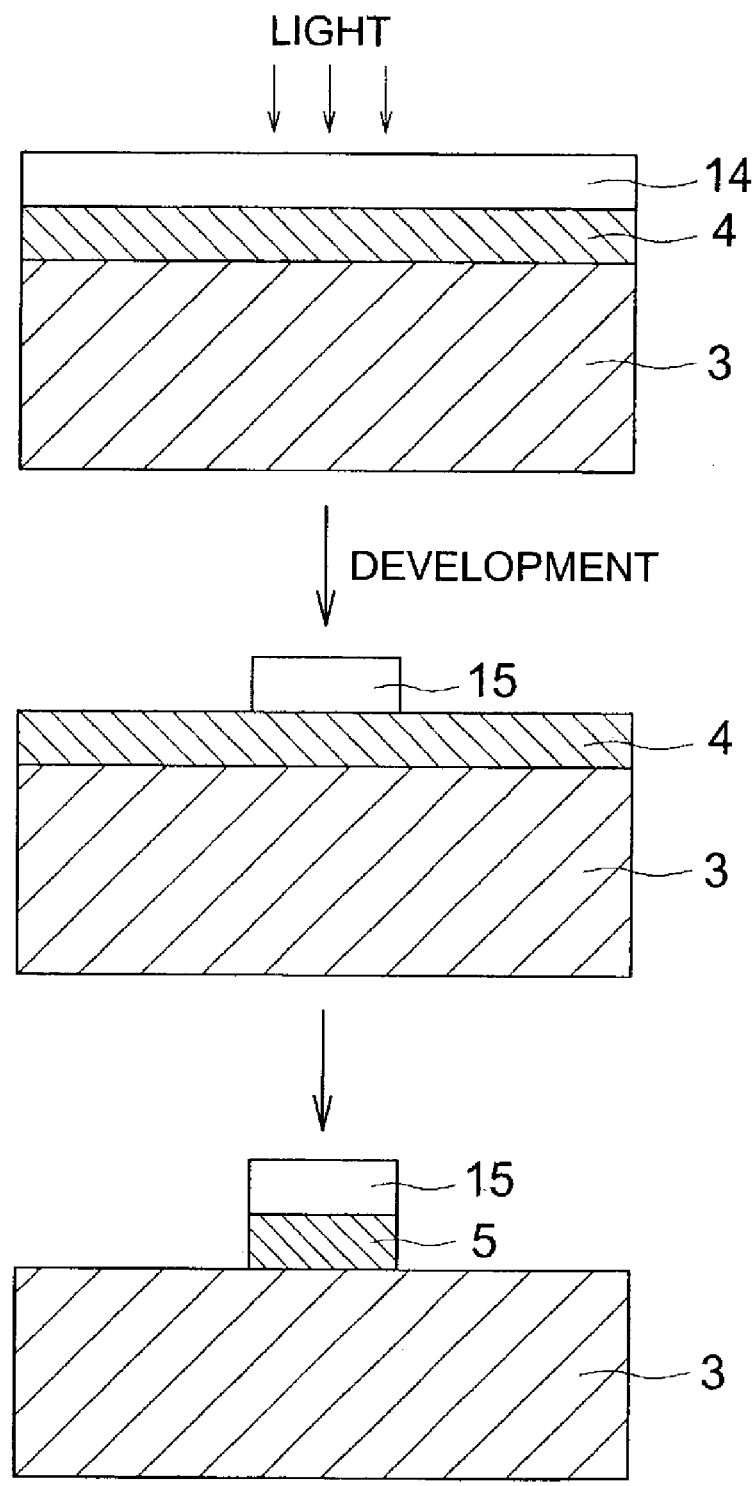
FIG. 6 shows a method of forming a metal particle dispersion layer in the form of electrode according to photolithography.

FIG. 6 shows a method of defining a pattern in the metal particle dispersion layer according to photolithography. FIG. 6 shows a method comprising forming a metal particle dispersion layer 4 on a base 3, coating a photoresist layer 14 on the metal particle dispersion layer, imagewise exposing the resulting material, developing the exposed material to form a photoresist (referred to also as a residual photoresist) 15, removing, with a remover, the metal particle dispersion layer at portions where the photoresist layer has been removed to form a metal particle dispersion layer 5 with a specific pattern, removing the residual photoresist on the metal particle layer 5 with a solvent, and heat-fusing the resulting metal particle dispersion layer 5 to form a source electrode or a drain electrode. Incidentally, the metal particles in the metal particle dispersion layer 5 can be heat-fused before removing the residual photoresist. As the remover used to remove a metal particle dispersion layer, there is water or an aqueous solution containing an organic solvent and/or a surfactant. The remover is preferably a dispersion medium used in the metal particle aqueous dispersion in the invention.

As a material for the photoresist layer, a well-known positive working or negative working material can be used, but a laser sensitive material is preferably used. As such a material for the photoresist, there are (1) a dye sensitized photo-polymerizable light-sensitive material disclosed in Japanese Patent O.P.I. Publication Nos. 11-271969, 2001-117219, 11-311859, and 11-352691, (2) an infrared laser-sensitive negative working material disclosed in Japanese Patent O.P.I. Publication No. 9-179292, U.S. Pat. No. 5,340, 699, and Japanese Patent O.P.I. Publication Nos. 10-90885, 2000-321780, and 2001-154374, and (3) an infrared laser-sensitive positive working material in Japanese Patent O.P.I. Publication Nos. 9-171254, 5-115144, 10-87733, 9- 43847, 10-268512, 11-194504, 11-223936, 11-84675, 11-174681, 7-282575, and 2000-56452, WO97/39894, and WO98/42507. The material of item (2) or (3) above is preferred in that its use is not limited to use in the dark. In the case where the photoresist layer is removed, the material of item (3), which is positive working, is most preferred.

The solvent for removing the residual photoresist is selected from organic solvents such as an alcohol solvent, an ether solvent, an ester solvent, a ketone solvent, and a glycol ether solvent, which are used for preparing a coating liquid for the photoresist layer.

The metal particle dispersion in the invention is subjected to patterning, and heat fused, whereby the source or drain electrode can be easily and precisely formed. The above method can easily form various shapes, which makes it possible to easily produce an organic thin-film transistor.

FIGS. 7(a) through 7(f) show constitution examples of the organic thin-film transistor of the invention.

Figure 7:
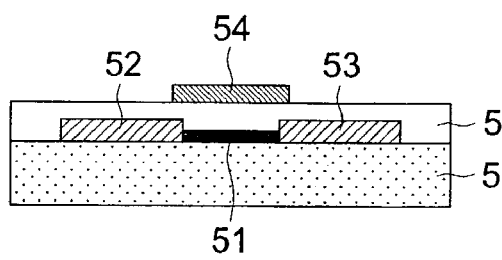
FIG. 7 shows a constitution example of the organic thin-film transistor of the invention.
Figure 7:
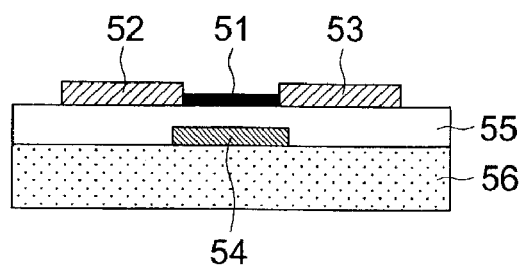
Figure 7:
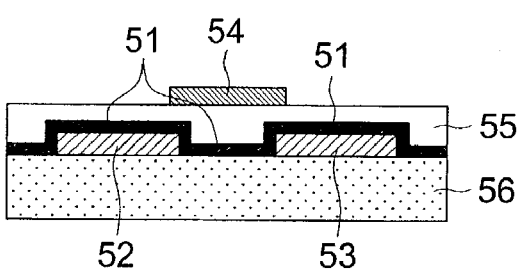
Figure 7:
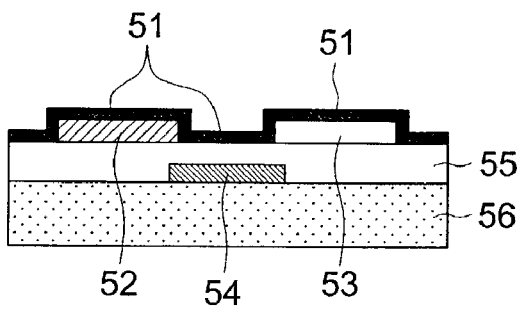
Figure 7:
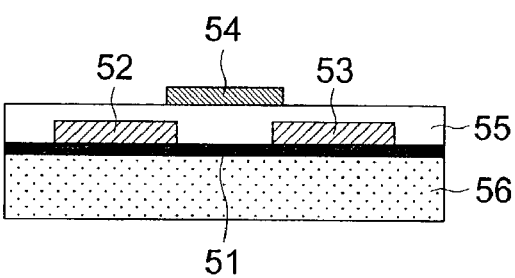
Figure 7:
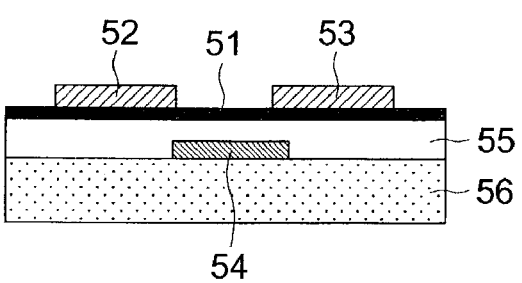

FIG. 7(a) shows an organic thin-film transistor which is obtained by subjecting a metal particle dispersion layer to patterning treatment employing the method described above to form electrode precursors (52 and 53) on a substrate 56 on which a known barrier layer is formed, jetting an organic semiconductor solution or an organic semiconductor dispersion on the surface of the substrate between the electrode precursors 52 and 54 according to an ink jet method, and drying the jetted to form an organic semiconductor layer 51, heat-fusing the metal particles by heating the metal particle dispersion layer to form a source electrode 52' and a drain electrode 53', forming a gate insulation layer 55 on the electrodes, and forming a gate electrode 54 on the gate insulation layer.

FIG. 7(b) shows an organic thin-film transistor which is obtained by subjecting a metal particle dispersion layer to patterning treatment employing the method described above to form electrode precursors (52 and 53) on a substrate 56, forming an organic semiconductor layer 51 on the entire surface of the resulting material, heat-fusing the metal particles by heating the metal particle dispersion layer to form a source electrode 52' and a drain electrode 53', forming a gate insulation layer 55 on the electrodes, and forming a gate electrode 54 on the gate insulation layer.

FIG. 7(c) shows an organic thin-film transistor which is obtained by forming an organic semiconductor layer 15 on a substrate 56, subjecting a metal particle dispersion layer to patterning treatment, heat-fusing the metal particles by heating the metal particle dispersion layer to form a source electrode 52' and a drain electrode 53', forming a gate insulation layer 55 on the electrodes, and forming a gate electrode 54 on the gate insulation layer.

FIG. 7(d) shows an organic thin-film transistor which is obtained by forming a gate electrode 54 on a substrate 56, forming a gate insulation layer 55 on the gate electrode, subjecting a metal particle dispersion layer on the gate insulation layer to patterning treatment employing the method described above to form electrode precursors (52 and 53), jetting an organic semiconductor solution or an organic semiconductor dispersion on the surface of the substrate between the electrode precursors 52 and 54 according to an ink jet method, and drying the jetted solution or dispersion to form an organic semiconductor layer 51, heat-fusing the metal particles by heating the metal particle dispersion layer to form a source electrode 52' and a drain electrode 53'.

FIG. 76(e) shows an organic thin-film transistor which is obtained by forming a gate electrode 54 on a substrate 56, forming a gate insulation layer 55 on the gate electrode, subjecting a metal particle dispersion layer on the gate insulation layer to patterning treatment employing the method described above to form electrode precursors (52 and 53), forming an organic semiconductor layer 51 on the entire surface of the resulting material, heat-fusing the metal particles by heating the metal particle dispersion layer to form a source electrode 52' and a drain electrode 53'.

FIG. 7(f) shows an organic thin-film transistor which is obtained by forming a gate electrode 54 on a substrate 56, forming a gate insulation layer 55 on the gate electrode, subjecting a metal particle dispersion layer on the gate insulation layer to patterning treatment employing the method described above to form electrode precursors (52 and 53), coating an organic semiconductor layer 51 on the entire surface of the resulting material, subjecting a metal particle dispersion layer on the organic semiconductor layer 51 to patterning treatment, heat-fusing the metal particles by heating the metal particle dispersion layer to form a source electrode 52' and a drain electrode 53'.

The heat-fusing of the metal particles by heating can be carried out at any time, for example, before or after forming the organic semiconductor layer, but it is preferably carried out after the organic semiconductor layer has been formed. The obtained transistor may be heated together with the source and drain electrodes to form the electrodes.

It is preferred in FIGS. 7(a), (b), (d), and (e) that the source and drain electrodes are heat-fused and formed immediately before the semiconductor layer is formed, and the subjected to known washing treatment. The washing treatment may be carried out employing a washing solution having high solubility and dispersibility of organic components, and is preferably carried out employing a dry etching method such as an oxygen plasma etching method or a UV-ozone treatment. The washing treatment is and more preferably carried out employing an oxygen plasma treatment of an atmospheric pressure plasma method disclosed in Japanese Patent Application No. 2001-377091. The washing treatment removes a residual dispersant of metal particles remaining on the surface of the electrode, resulting in reduction of contact resistance between the organic semiconductor and the electrode. After the transistor is prepared, additional heat treatment may be carried out.

In the invention, it is preferred that a source electrode and drain electrode each containing an electrically conductive polymer is further provided. The electrically conductive polymer is preferably a π conjugate compound.

Examples of the π conjugate compound include polypyrroles such as polypyrrole, poly(N-substituted pyrrole), poly (3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly (p-phenylenevinylene); polyanilines such as polyaniline, poly(N-substituted aniline), poly(3-substituted aniline), and poly(2,3-substituted aniline); polyacetylnenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group;

polymers such as polyvinyl carbazoles, polyphenylene sulfide, and polyvinylene sulfide; and polycyclic condensation products described in Japanese Patent O.P.I. Publication No. 11-195790.

Of these π conjugate compounds, preferably employed are at least one selected from the group consisting of oligomers, which have, as a repeating unit, a substituted or unsubstituted thienylene group, a substituted or unsubstituted vinylene group, a substituted or unsubstituted thienylenevinylene group, a substituted or unsubstituted phenylenevinylene group, a substituted or unsubstituted p-phenylene group or at least two kinds thereof, and have a repeating unit number of from 4 to 10; polymers which have the same repeating unit as above and a repeating unit number of at least 20; condensed polycyclic aromatic compounds such as pentacene; fullerenes; condensed cyclic compounds having a tetracarboxylic acid diimide group; of condensed ring compounds or metallo-phthalocyanines.

The method of manufacturing the organic thin-film transistor in the invention preferably comprises a step of employing photolithography, and more preferably comprises the following steps S1 through S8.

S1: a step of forming a gate electrode (and a gate busline) on a substrate;

S2: a step of forming a gate insulation layer, which covers the gate electrode

S3: a step of forming an organic semiconductor layer on the gate insulation layer;

S4: a step of forming an electrode precursor layer on the organic semiconductor layer;

S5: a step of forming a photoresist layer on the electrode precursor layer;

S6: a step of exposing the photoresist layer;

S7: a step of forming a photoresist (a residual photoresist) in the form of electrodes and an electrode precursor layer under the photoresist by development S8: a step of removing the residual photoresist by a solvent to reveal the electrode precursor layer in the form of electrode and heat fusing the revealed electrode precursor layer to form a source electrode and a drain electrode.

These steps will be explained below employing FIGS. 8 through 14.

Figure 8:
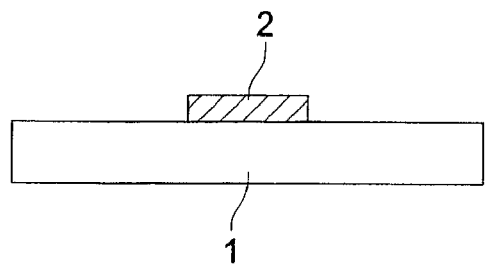
FIGS. 8 through 14 show one embodiment of the manufacturing methods of the organic thin-film transistor of the invention.

S1: a step of forming a gate electrode on a substrate (shown in FIG. 8)

As is illustrated in FIG. 8, a gate electrode 2 is formed on a substrate 1.

Methods for forming the electrode include a method in which a photolithographic method or a lift-off method, known in the art, is applied to an electrically conductive layer of the materials described above, which has been formed employing a vacuum deposition method or a sputtering method, and a method in which a resist layer is subjected to etching which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing to obtain an electrode. An electrode may also be formed in such a manner that a coated layer is subjected to lithography or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing.

Figure 9:
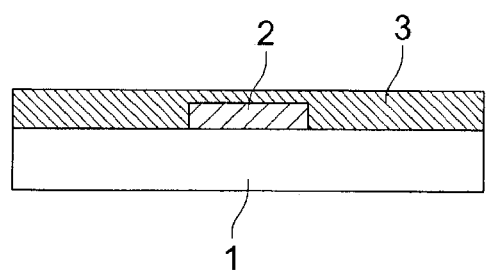

S2: a step of forming the gate insulation layer covering the gate electrode (shown in FIG. 9)

As is illustrated in FIG. 9, the gate insulation layer 3 is formed on the entire surface of the substrate 1 having the gate electrode 2.

Materials used in the gate insulation layer and the gate insulation layer forming method are the same as described above.

Figure 10:
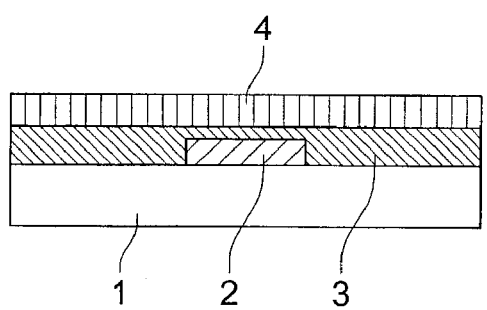

S3: a step of forming the organic semiconductor layer on the gate insulation layer (shown in FIG. 10)

As is illustrated in FIG. 10, an organic semiconductor layer 4 is formed on the gate insulation layer 3 so that the former covers the latter.

The methods for forming the organic semiconductor layer 4 include a dry process such as a vacuum deposition method, a molecular beam epitaxial growth method, an ion cluster beam method, a low energy ion beam method, an ion plating method, a CVD method, a sputtering method, a plasma method, an electrolytic polymerization method or a chemical polymerization method, and a wet process such as a spray coating method, a spin coating method, a blade coating method, a dip coating method, a casting method, a roll coating method, an bar coating method, a die coating method, or an LB method. These methods can be used due to kinds of materials used. Among them, the spin coating method, the blade coating method, the dip coating method, the roll coating method, the bar coating method, and the die coating method, which can form a thin layer easily and precisely, are preferred in view of productivity. The thickness of the organic semiconductor layer is not specifically limited. The thickness of the active layer comprised of the organic semiconductor layer has a great influence on characteristics of the transistor, and varies depending on kinds of organic semi-conductive materials used. The thickness of the organic semiconductor layer is ordinarily from not more that 1 μm, preferably from 10 to 300 nm, and most preferably from 20 to 100 nm.

Figure 11:
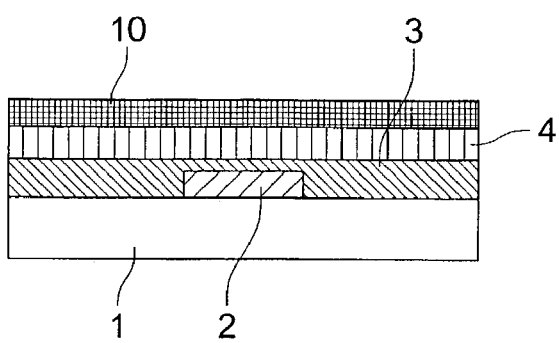

S4: a step of forming, on the organic semiconductor layer, an electrode precursor layer (shown in FIG. 11).

The metal particle dispersion, particularly metal particle aqueous dispersion as described above, is coated on the organic semiconductor layer 4 to form the electrode precursor layer 10.

As the methods of forming the electrode precursor layer 10, a coating method such as the spray coating method, the spin coating method, the blade coating method, the dip coating method, the casting method, the roll coating method, the bar coating method, or the die coating method can be used.

Figure 12:
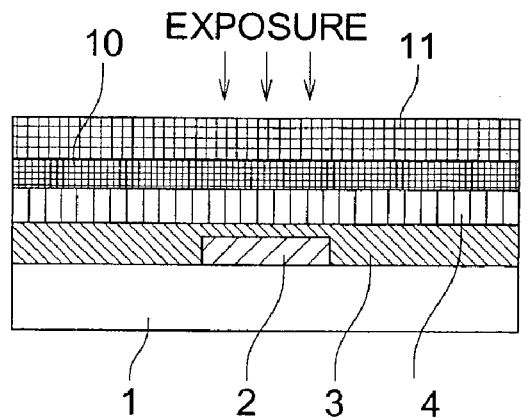

S5: a step of forming a photoresist layer on the electrode precursor layer (shown in FIG. 12)

A solution of a photoresist layer (referred to also as light sensitive resin layer) is coated on the entire surface of the electrode precursor layer 10 to form a photoresist layer 11.

As a material for the photoresist layer, a well-known positive working or negative working material can be used, but a laser sensitive material is preferably used. As such a material for the photoresist, there are (1) a dye sensitized photo-polymerizable light-sensitive material disclosed in Japanese Patent O.P.I. Publication Nos. 11-271969, 2001-117219, 11-311859, and 11-352691, (2) an infrared laser-sensitive negative working material disclosed in Japanese Patent O.P.I. Publication No. 9-179292, U.S. Pat. No. 5,340, 699, and Japanese Patent O.P.I. Publication Nos. 10-90885, 2000-321780, and 2001-154374, and (3) an infrared laser-sensitive positive working material in Japanese Patent O.P.I. Publication Nos. 9-171254, 5-115144, 10-87733, 9-43847, 10-268512, 11-194504, 11-223936, 11-84675, 11-174681, 7-282575, and 2000-56452, WO97/39894, and WO98/42507. The material of item (2) or (3) above is preferred in that its use is not limited to use in the dark. In the case where the photoresist layer is removed, the material of item (3), which is positive working, is most preferred. Further, in order to carry out operation under room light, a light sensitive material sensitive to a 700 nm or more infrared laser having an output power of not less than 50 mW is preferred.

A composition for forming the light sensitive layer preferably contains a phenol resin such as novolak resin or polyvinyl phenol. Examples of the novolak resin include phenol•formaldehyde resin, cresol•formaldehyde resin, phenol•cresol•formaldehyde cocondensation resin disclosed in Japanese Patent O.P.I. Publication No. 55-57841, and a cocondensation resin of p-substituted phenol and phenol or cresol with formaldehyde disclosed in Japanese Patent O.P.I. Publication No. 55-127553.

Solvents for preparing a coating liquid of the photoresist layer (the light-sensitive resin layer) include propylene glycol monomethyl ether, propylene glycol monoethyl ether, methyl cellosolve, methyl cellosolve acetate, ethyl cellosolve, ethyl cellosolve acetate, dimethylformamide, dimethylsulfoxide, dioxane, acetone, cyclohexanone, trichloroethylene, and methyl ethyl ketone. These solvents may be used singly or as a mixture of two or more kinds thereof.

As a method for forming a photoresist layer, there is a coating method such as a spray coating method, a spin coating method, a blade coating method, a dip coating method, a casting method, a roll coating method, a bar coating method or a die coating method. The step S4 of forming the electrode precursor layer and the step S5 of forming the photoresist layer may be carried out successively or simultaneously.

S6: a step of exposing the photoresist layer (shown in FIG. 12)

The step S6 is a step of subjecting the photoresist layer 11 to patterning exposure.

As a light source for the patterning exposure, there are an argon laser, a semi-conductive laser, a He—Ne laser, a YAG laser, and a carbon dioxide gas laser, and a semi-conductive laser, which has an emission wavelength at the infrared wavelength regions, is preferred. The output power of the laser is suitably not less than 50 mW, and preferably not less than 100 mW.

Figure 13:
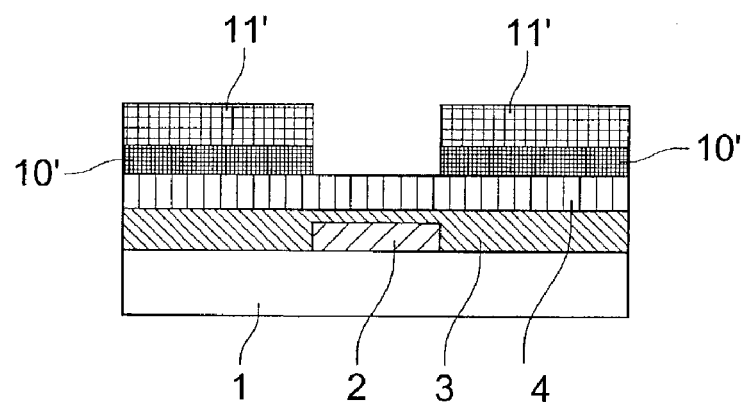

S7: a step of forming a photoresist (residual photoresist) in the form of electrodes and an electrode precursor layer under the photoresist by development (shown in FIG. 13)

The exposed photoresist layer is developed with a developer to form a photoresist (residual photoresist) 11' in the form of electrode and an electrode precursor layer 10' in the form of electrode.

The developer used for developing the exposed photoresist layer is preferably an aqueous alkali developing solution. As an alkali agent of the aqueous alkali developing solution, an alkali compound such as an organic or inorganic alkali compound is used. Examples of the inorganic alkali compound include sodium hydroxide, potassium hydroxide, sodium carbonate, potassium carbonate, sodium metasilicate, potassium metasilicate, sodium secondary phosphate, or sodium tertiary phosphate, and examples of the organic alkali compound include ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,3-diazabicyclo-[5,4,0]-7-undecane or 1,5-diazabicyclo-[4,3,0]-5-nonane. In the invention, the concentration of the alkali compound in the aqueous alkali developing solution is ordinarily from 1 to 10% by weight, and preferably from 2 to 5% by weight.

The developing solution may optionally contain an anionic surfactant, an amphoteric surfactant or an organic solvent such as alcohol. Examples of the organic solvent include propylene glycol, ethylene glycol monophenyl ether, benzyl alcohol and n-propyl alcohol.

The exposed photoresist layer is developed to form a photoresist in the electrode form. The metal particle dispersion layer as an electrode precursor under the photoresist layer to be removed by development is removed with a remover, preferably water. The exposed photoresist layer and the metal particle dispersion layer may be simultaneously removed.

Figure 14:
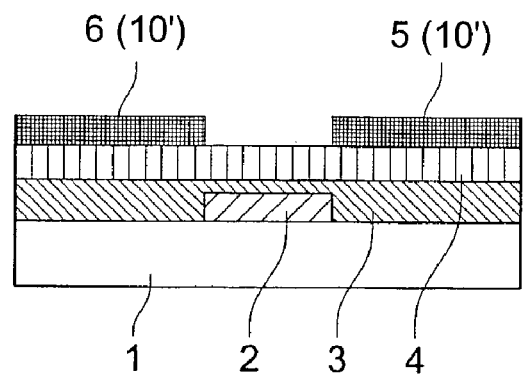

S8: a step of removing the residual photoresist by a solvent to reveal the electrode precursor layer in the form of electrode and heat fusing the revealed electrode precursor layer to form a source electrode and a drain electrode (shown in FIG. 14)

As shown in FIG. 14, the step S8 in which the residual photoresist 11' is removed by a solvent is carried out after the step 7 to reveal the electrode precursor layer 10' in the form of electrode, and the revealed electrode precursor layer 10' is heat fused to form a source electrode 5 and a drain electrode 6.

The solvent for removing the residual photoresist in the form of electrode the is selected from the organic solvents such as an alcohol solvent, an ether solvent, an ester solvent, a ketone solvent, and a glycol ether solvent, which are used for preparing a coating liquid of the light-sensitive resin layer. The ether or ketone solvent is preferred, and the ether solvent such as tetrahydrofuran (THF) is most preferred.

Where the step of removing the residual photoresist 11' is included, the heat-fusing of the metal particles is conducted after the photoresist is removed.

Figure 15:
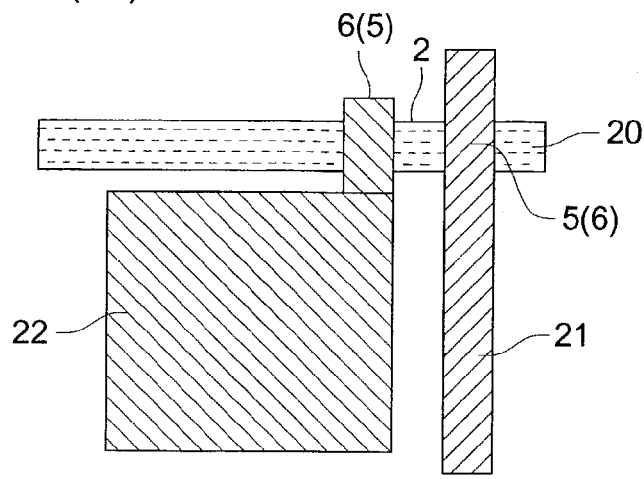
FIGS. 15(a) through 15(c) show a plan view of an example of an organic thin-film transistor in which a gate busline, a source busline, and an input-output electrode are formed.
Figure 15:
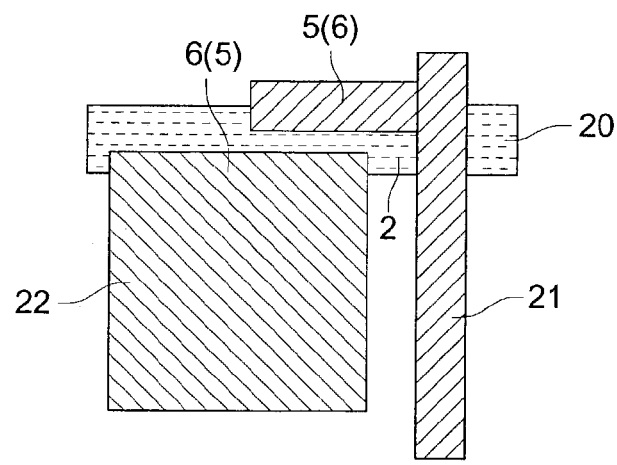
Figure 15:
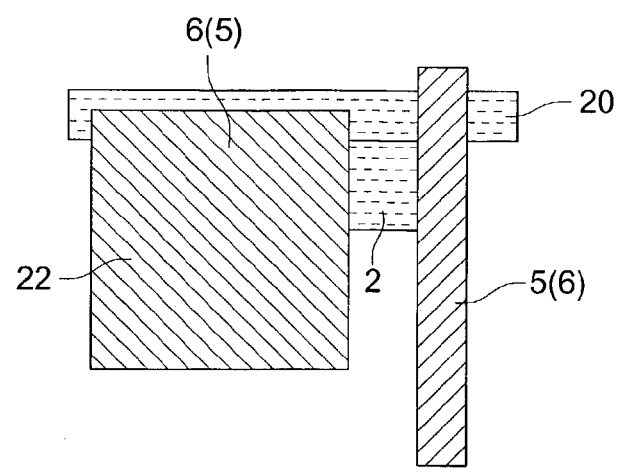

FIGS. 15(a) through 15(c) show a plan view of an example of an organic thin-film transistor in which a gate busline, a source busline, and an input-output electrode are formed.

FIG. 15(a) shows an example in which a gate electrode 2 is formed at a part of a gate busline 20, a source electrode 5 or a drain electrode 6 at a part of a source busline 21, and a source electrode 5 or a drain electrode 6 at a protrusion portion of an input-output electrode 22.

An active matrix is formed by numbers of gate buslines 20, numbers of source buslines 21, and numbers of organic thin-film transistors described above. To the input-output electrode 22 is connected a liquid crystal element, an electrophoresis element, a photo-electromotance element, or a photoconductive element. In the display to which a liquid crystal element or an electrophoresis element is connected, the source busline 21 forms the source electrode 5, the input-output electrode 22 is an output electrode and forms the drain electrode 6.

In the sensor to which a photo-electromotance element or a photoconductive element is connected, the source busline 21 forms the drain electrode 6, and the input-output electrode 22 is an output electrode and forms the source electrode 5.

FIG. 15(b) shows an example in which a source electrode 5 or a drain electrode 6 is formed at a protrusion portion provided on the source busline 21. FIG. 15(c) shows an example in which a gate electrode 2 is formed at a protrusion portion provided on the gate busline 20.

Figure 16:
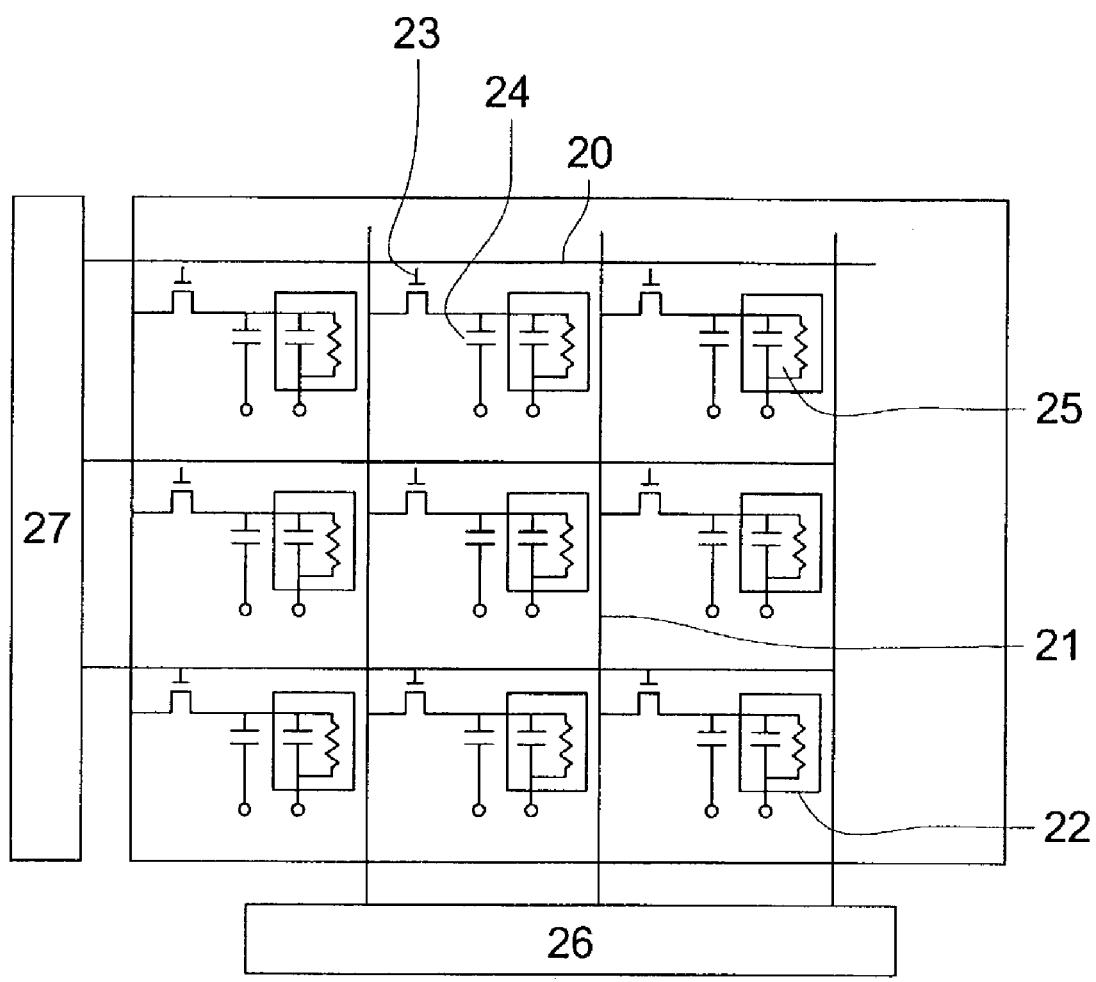
FIG. 16 shows one embodiment of a circuit diagram of the organic thin-film transistor sheet of the invention.

FIG. 16 shows one embodiment of a circuit diagram of the organic thin-film transistor sheet of the invention.

Each of cells arranged in the matrix form has an organic thin-film element 23, a display electrode 22 as an input-output electrode, a storage capacitor 24, and a display element 25. The source busline 21 is connected to the source electrode of the organic TFT element 23, the gate busline 20 to the gate electrode of the organic TFT element 23, and the display electrode 22 to the drain electrode of the organic TFT element 23. Numerical number 26 shows a vertical drive circuit, numerical number 27 a horizontal drive circuit, and numerical number 25 a display element such as a liquid crystal or an electrophoresis element. The display element 25 is shown in an equivalent circuit.

When the scanning lines 20 are switched on successively by the horizontal drive circuit 27, and a data signal is supplied from the vertical drive circuit, electric charge is stored in the storage capacitor 24 through the organic TFT element 23, whereby the drive voltage is generated in the display electrode 22 to drive the display element 25. The electric charge stored in the storage capacitor 24 is maintained by the switching function of the organic TFT element 23 until the next frame is selected.

The preferred organic thin-film transistor of the invention is an organic thin-film transistor comprising a source electrode and a drain electrode each comprised of two layers different conductive materials. The method of manufacturing such an organic thin-film transistor in the invention preferably comprises the following steps S11 through S18.

S11: a step of forming a gate electrode and a gate busline on a substrate

S12: a step of forming a gate insulation layer, which covers the gate electrode

S13: a step of forming an organic semiconductor layer on the gate insulation layer S14: a step of forming an electrode precursor layer on the organic semiconductor layer S15: a step of forming a photoresist layer on the electrode precursor layer S16: a step of exposing the photoresist layer S17: a step of forming a source electrode, a drain electrode, a source busline, and a display electrode by developing the exposed photoresist layer with a developer S18: a step of removing the residual photoresist to reveal the electrode precursor layer and heat fusing the metal particles in the electrode precursor layer to form a source electrode and a drain electrode These steps will be explained below employing FIGS. 17 through 24.

Figure 17:
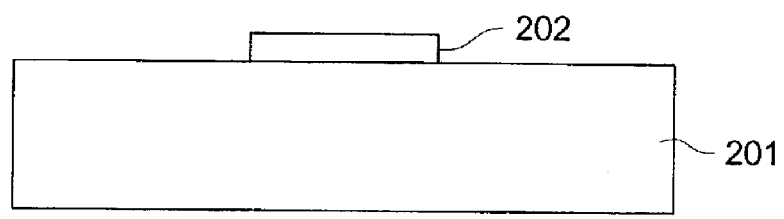
FIGS. 17 through 24 show one embodiment of the manufacturing methods of the organic thin-film transistor of the invention comprising a source electrode and a drain electrode each comprised of two layers different conductive materials.

S11: a step of forming a gate electrode and a gate busline on a substrate (shown in FIG. 17)

As is illustrated in FIG. 17, a gate electrode 202 is formed on a substrate 201.

Methods for forming the electrode are the same method as described in the above step S1.

Figure 18:
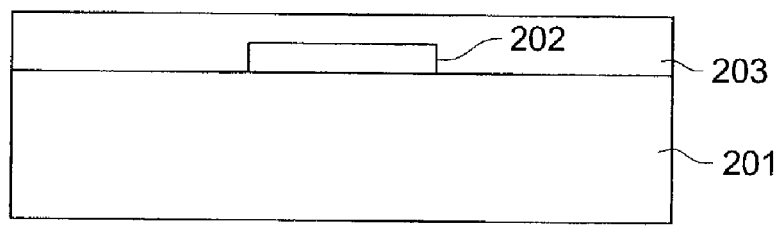

S12: a step of forming the gate insulation layer covering the gate electrode (shown in FIG. 18)

As is illustrated in FIG. 18, the gate insulation layer 203 is formed on the entire surface of the substrate 201 having the gate electrode 202. Methods for forming the gate insulation layer are the same method as described in the above step S2.

Figure 19:
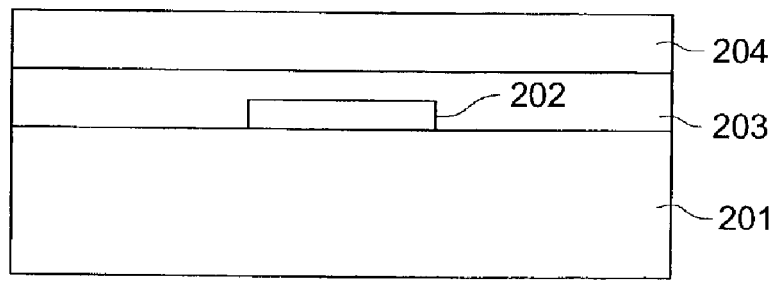

S13: a step of forming the organic semiconductor layer on the gate insulation layer (shown in FIG. 19)

As is illustrated in FIG. 19, an organic semiconductor layer 204 is formed on the gate insulation layer 203 so that the former covers the latter. The methods for forming the organic semiconductor layer 204 are the same method as described in the above step S3.

Figure 20:
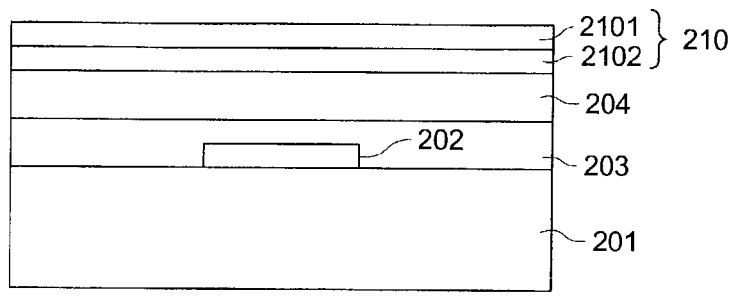

S14: a step of forming, on the organic semiconductor layer, an electrode precursor layer (shown in FIG. 20).

As is illustrated in FIG. 20, two aqueous dispersions of different metal particles are simultaneously coated on the organic semiconductor layer 204, and preliminarily dried at 100° C. for 3 minutes to form an electrode precursor layer 210 including a first electrode precursor layer 2101 and a second electrode precursor layer 2102. The methods of forming the electrode precursor layer 210 (2101 and 2102), a coating method such as the spray coating method, the spin coating method, the blade coating method, the dip coating method, the casting method, the roll coating method, the bar coating method, or the die coating method can be used. Typically, two aqueous dispersions of different metal particles are simultaneously coated on the organic semiconductor layer, and preliminarily dried at 100° C. for 3 minutes to form an electrode precursor layer 210 including a first electrode precursor layer 2101 and a second electrode precursor layer 2102, one for a precursor layer for a source electrode and the other for a precursor layer for a drain electrode each having different metal particles.

Figure 21:
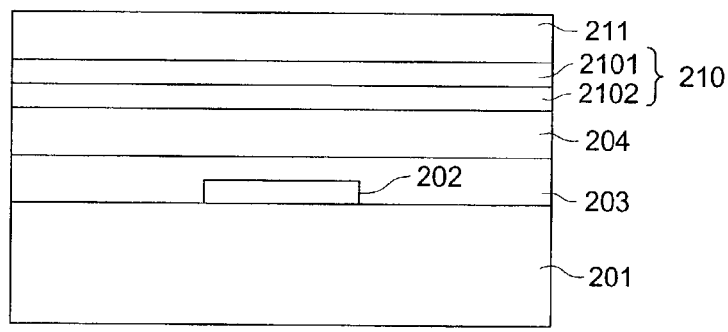

S15: a step of forming a photoresist layer on the electrode precursor layer (shown in FIG. 21)

A photoresist (referred to also as light sensitive resin) solution is coated on the entire surface of the electrode precursor layer 210 (2101 and 2102) to form a photoresist layer 211. As material for the photoresist layer, a well-known positive working or negative working material can be used, but the laser sensitive materials as described above are preferably used.

Figure 22:
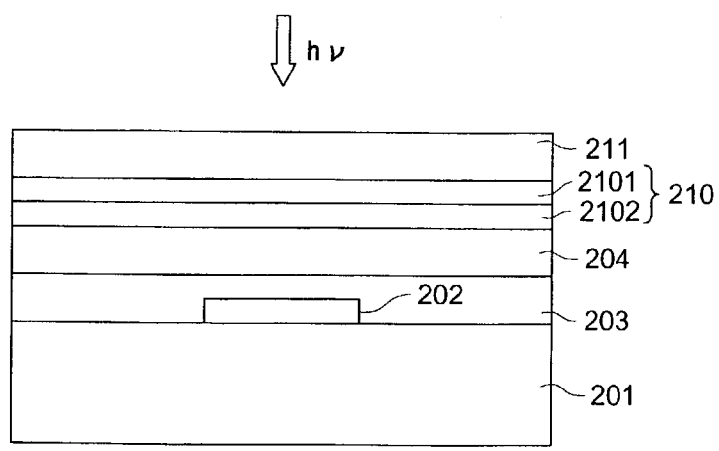

S16: a step of exposing the photoresist layer (shown in FIG. 22)

As is illustrated in FIG. 22, the step S6 is a step of subjecting the photoresist layer 211 to patterning exposure. Exposure is preferably carried out in an inline. As a light source for the patterning exposure, there are an argon laser, a semi-conductive laser, a He—Ne laser, a YAG laser, and a carbon dioxide gas laser, and a semi-conductive laser, which has an emission wavelength at the infrared wavelength regions, is preferred. The output power of the laser is suitably not less than 50 mW, and preferably not less than 100 mW.

Figure 23:
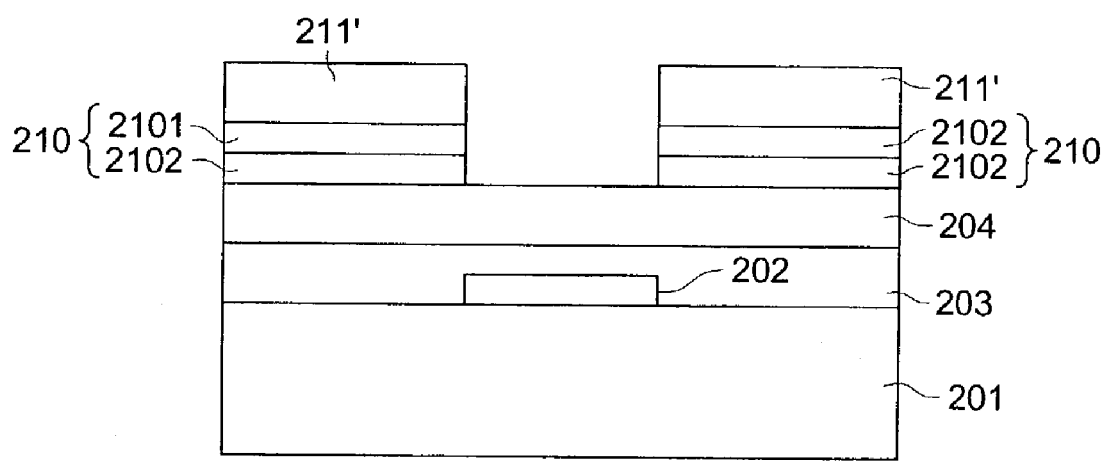

S17: a step of forming a photoresist in the form of electrodes by development (shown in FIG. 23)

As is illustrated in FIG. 23, the exposed photoresist layer 211 is developed with a developer to form a photoresist (residual photoresist) 211' in the form of electrode. FIG. 23 shows an example in which together with a photoresist layer to have been removed, an electrode precursor layer 210 under the photoresist layer is removed.

Figure 24:
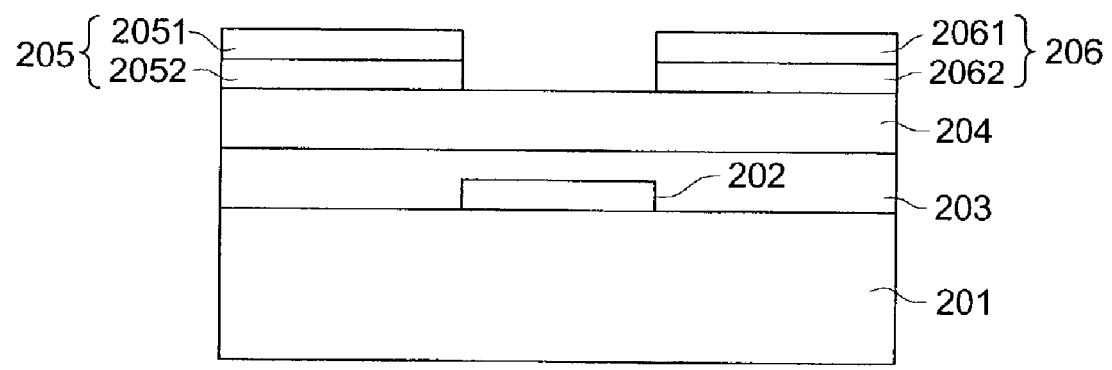

S18: a step of removing the residual photoresist to reveal the electrode precursor layer and heat fusing the metal particles in the electrode precursor layer to form a source electrode and a drain electrode (shown in FIG. 24)

The resulting residual photoresist 211' is removed employing a solvent to reveal the electrode precursor layer. As the solvent, the solvent as described above is used. Subsequently, the revealed electrode precursor layer is subjected to heat treatment and the metal particles in electrode precursor layer are heat-fused to form a source electrode 205 (2051 and 2052) and a drain electrode 206 (2061 and 2062). The heat treatment is carried out at preferably 100 to 300° C. and more preferably 150 to 200° C. Herein, a preferred example is one in which a source electrode and a drain electrode, each contacting the organic conductor layer, is comprised of a gold layer with a thickness of 30 nm and a source electrode and a drain electrode, which do not contact the organic conductor layer, is comprised of a copper layer with a thickness of 200 nm.

Incidentally, the above steps 12 through 15 can be simultaneously carried out. That is, a gate insulation layer, an organic semiconductor layer, a electrode precursor layer and a photoresist layer are simultaneously formed by simultaneous multilayer coating by suitably selecting a solvent and materials for the gate insulation layer, the organic semiconductor layer, the electrode precursor layer and the photoresist layer. The resulting organic thin-film transistor may be subjected to sealing treatment employing an atmospheric pressure plasma method to form a film of silicon oxide, silicon nitride, or titanium oxide.

The organic TFT device in the invention is suitable for being manufactured through roll to roll and can be manufactured in large quantities at low cost.

The present invention will be explained below employing examples, but is not limited thereto.

EXAMPLE 1

A thin-film transistor having the structure as shown in FIG. 7(f) was prepared. A gate electrode 54 composed of a metal foil was formed on a polyethersulfone (PES) film substrate 56, a gate insulation layer 55 of silicon oxide was formed on the gate electrode according to the atmospheric pressure plasma method, and further, a solution, in which regioregular poly(3-n-hexylthiophene-2,5-diyl) (produced by Aldrich Co., Ltd.) was dissolved in chloroform, was coated on the gate insulation layer and air dried to form an organic semiconductor layer 51.

Hereinafter, the film obtained above, having the gate electrode, the gate insulation layer and the organic semiconductor layer on the substrate, is referred to as the organic semiconductor film.

An aqueous dispersion of gold particles with an average particle size of 10 nm (containing 0.1% of a nonionic surfactant) was used as ink for ink jet recording. The ink was jetted on the resulting organic semiconductor film from an ink-jet head, and dried at 50° C. to form a gold particle-containing layer with a thickness of 0.2 µm.

The resulting film was further heated at 300° C. to fuse the gold particles to form a source electrode 52 and a drain electrode 53. Thus, an organic thin-film transistor with a channel length of 20 µm was obtained. The resulting organic thin-film transistor exhibited a good p-channel FET property.

EXAMPLE 2

An aqueous dispersion of gold particles with an average particle size of 10 nm was coated on the organic semiconductor- film obtained in Example 1, and dried at 50° C. to form a gold particle-containing layer with a thickness of 0.2 µm. A 2 µm thick polyvinyl phenol layer was provided on the gold particle-containing layer. The gold particle-containing layer was exposed at an energy density of 200 mJ/cm2 at a writing resolution of 4000 dpi ("dpi" represents a dot number per 2.54 cm.), employing a 50 mW semiconductor laser emitting a 830 nm light, whereby the gold particles were heat-fused. After that, the resulting film was washed away with an aqueous alkali solution to form a source electrode 52 and a drain electrode 53 each having a width of 7 µm. The resulting organic thin-film transistor exhibited a good FET property as in Example 1.

EXAMPLE 3

An aqueous dispersion of gold particles with an average particle size of 10 nm was coated on the organic semiconductor film obtained in Example 1, and dried at 50° C. to form a gold particle-containing layer with a thickness of 0.2 µm. A 2 µm thick polyvinyl phenol layer was provided on the gold particle-containing layer. The gold particle-containing layer was heated at an energy density of 200 mJ/cm2 at a writing resolution of 4000 dpi employing a thermal head, whereby the gold particles were heat-fused. After that, the resulting film was treated in the same way as in Example 2, to form a source electrode 52 and a drain electrode 53 each having a width of 130 µm. The resulting organic thin-film transistor exhibited a good FET property as in Example 1.

EXAMPLE 4

An aqueous dispersion of gold particles with an average particle size of 10 nm was coated on the organic semiconductor film obtained in Example 1, and dried at 50° C. to form a gold particle-containing layer with a thickness of 0.2 µm. A positive working photoresist layer was formed on the gold particle-containing layer, and exposed in the electrode form through a mask. The resulting material was developed employing an aqueous alkali solution to remove the photoresist layer at exposed portions, and sufficiently washed with pure water to remove the unveiled gold particle-containing layer (at unexposed portions). After that, the resulting film was heated at 200° C. to heat-fuse the gold particles to form a source electrode 52 and a drain electrode 53. The resulting organic thin-film transistor exhibited a good FET property as in Example 1.

EXAMPLE 5

An aqueous dispersion of gold particles with an average particle size of 10 nm was coated on the organic semiconductor film obtained in Example 1, and dried at 50° C. to form a gold particle-containing layer with a thickness of 0.2 µm. A light sensitive layer described in Example 1 of Japanese Patent O.P.I. Publication No. 11-115114 was formed on the gold particle-containing layer. The resulting film was exposed in the electrode form at an energy density of 200 mJ/cm2, employing a 100 mW semiconductor laser emitting a 830 nm light, developed employing an aqueous alkali solution to remove the light sensitive layer at exposed portions, and sufficiently washed with pure water to remove the gold particle-containing layer at portions where the light sensitive layer was removed. The residual photoresist (light sensitive layer) was removed with THF. After that, the resulting film was heated at 200° C. to heat-fuse the gold particles and form a source electrode 52 and a drain electrode 53. Thus, an organic thin-film transistor was obtained, which exhibited a good FET property as in Example 1.

EXAMPLE 6

The photoresist layer of Example 5 above was coated on the organic semiconductor film obtained in Example 1. The resulting film was exposed and developed in the same manner as in Example 5 to form a photoresist in the electrode form. An aqueous dispersion of gold particles with an average particle size of 10 nm was coated on the resulting photoresist, and dried at 50° C. to form a gold particle-containing layer with a thickness of 0.2 µm. Subsequently, the photoresist was removed with THF to form a gold particle-containing layer in the electrode form on the organic semiconductor film. The resulting film was heated at 200° C. to heat-fuse the gold particles and form a source electrode 52 and a drain electrode 53. Thus, an organic thin-film transistor was obtained, which exhibited a good FET property as in Example 1.

EXAMPLE 7

The photoresist layer of Example 5 above was coated on the organic semiconductor film obtained in Example 1. The resulting film was exposed and developed in the same manner as in Example 5 to form a photoresist in the electrode form. An aqueous dispersion of gold particles with an average particle size of 10 nm was coated on the resulting photoresist, and dried at 50° C. to form a gold particle-containing layer with a thickness of 0.2 µm. Subsequently, the surface of the photoresist was squeegeed with a squeegeer to leave a gold particle-containing layer at portions where the photoresist layer is absent and to form a gold particle-containing layer in the electrode form on the organic semiconductor film. The resulting film was heated at 200° C. to heat-fuse the gold particles and form a source electrode 52 and a drain electrode 53. Thus, an organic thin-film transistor was obtained, which exhibited a good FET property as in Example 1.

EXAMPLE 8

The following coating composition was coated on a 1000 Å thick aluminum layer formed on a 150 µm thick polyimide film, and dried at 90° C. for 90 minutes to form a photoresist layer.

| Coating composition | |
|---|---|
| Dye A | 1 part |
| Binder A | 5 parts |
| Novolak resin binder | 70 parts |
| (Condensation product of phenol, m-, p-mixed cresol, and formaldehyde, Mn = 500, Mw = 2500, phenol:m-cresol:p-cresol = 20:48:32) | |
| Photo acid generating agent | 3 parts |
| (2,6-Bistrichloromethyl-4-phenyl-1,3,5-triazine) | |
| Propylene glycol monomethyl ether | 1000 parts |
| Compound A | 20 parts |
| Fluorine-containing surfactant | 0.5 parts |
| (S-381 produced by Asahi Glass Co., Ltd.) | |
| Methyl lactate | 700 parts |
| Methyl ethyl ketone | 200 parts |

(Synthesis of Compound A)

A mixture of 1.0 mol of 1,1-dimethoxycyclohexane, 1.0 mol of triethylene glycol, 0.003 mol of p-toluene sulfonic acid hydrate and 500 ml of toluene was reacted at 100° C. for one hour while stirring, then gradually heated to 150° C., and further reacted at 150° C. for 4 hours. Methanol produced on reaction was removed during reaction. The reaction mixture was cooled, sufficiently washed with water, washed with a 1% NaOH aqueous solution, and then with a 1M NaOH aqueous solution. The resulting mixture was further washed with an aqueous sodium chloride solution, dried over anhydrous potassium carbonate, and concentrated under reduced pressure. The concentrated product was dried at 80° C. for ten hours under vacuum to obtain a waxy compound (compound A). The weight average molecular weight Mw of the compound, which was measured according to GPC, was 1500 in terms of polystyrene.

Binder A

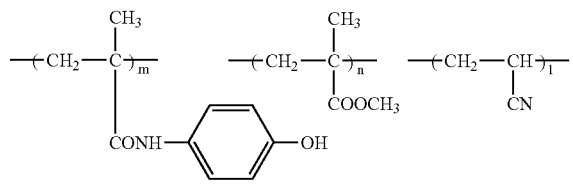

(Mw=22000, Mw/Mn=1.5, m:n:l=30:40:30 by mol %)

Dye A

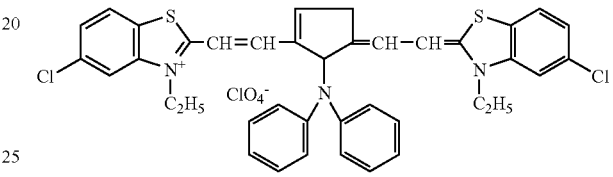

The photoresist layer (with a thickness of 2 µm) was exposed at an energy density of 200 mJ/cm² employing a 100 mW semiconductor laser emitting (830 nm light) to form a gate electrode pattern. The photoresist layer at exposed portions was removed with an alkali developing solution, and the unveiled aluminum layer was removed with an etching solution (a ferric chloride solution). Further, the residual photoresist was removed with methyl ethyl ketone. The resulting film material was washed sufficiently.

A gate insulation layer with a thickness of 300 nm, comprised of silicon oxide, was formed on the surface of the film material on the aluminum layer side according to an atmospheric pressure plasma method.

A solution in which regioregular substance of purified poly(3-n-hexylthiophene-2,5-diyl) (produced by Aldrich Co., Ltd.) was dissolved in chloroform was coated on the gate insulation layer and subjected to drying in an atmosphere of nitrogen to form an organic semiconductor layer with a thickness of 50 nm. After that, an aqueous dispersion of gold particles with an average particle diameter of 10 nm, manufactured according to the metal particle dispersion manufacturing method described in Japanese Patent O.P.I. Publication No. 11-80647, was coated on the organic semiconductor layer above, and dried at 100° C. for 5 minutes to form an electrode precursor layer with a thickness of 0.5 µm. Subsequently, the same photoresist layer as described above was formed on the electrode precursor layer, exposed to give patterns of a source electrode and a drain electrode, and developed in the same manner as above, whereby both the photoresist layer and the metal particle-containing layer at exposed portions were simultaneously removed. Subsequently, the residual photoresist was removed with MEK. The resulting material was heated at 200° C. in an atmosphere of nitrogen, whereby the metal particles were heat fused to form a source electrode and a drain electrode.

The organic thin-film transistor prepared as above exhibited a good p-channel type operation property which was off in an ordinary state. Carrier mobility at saturation region of this transistor was 0.05 cm²/V·sec.

EXAMPLE 9

A gate electrode, a gate insulation layer, and an organic semiconductor layer was formed in the same manner as in Example 1, except that the gate electrode was formed as a part of a gate bus line (scanning line). After that, an aqueous dispersion of gold particles with an average particle diameter of 10 nm, manufactured according to the metal particle dispersion manufacturing method described in Japanese Patent O.P.I. Publication No. 11-80647, was coated on the organic semiconductor layer, and dried at 100° C. for 5 minutes to form an electrode precursor layer with a thickness of 0.5 μm.

The same photoresist layer as in Example 1 was formed on the electrode precursor layer, exposed to give a pattern of a source bus line (signal line) including a source electrode and a pattern of a display electrode including a drain electrode, and developed in the same manner as above, whereby both the photoresist layer and the metal particle-containing layer at exposed portions were simultaneously removed. Subsequently, the residual photoresist was removed with MEK. The resulting material was heated at 200° C. in an atmosphere of nitrogen, whereby the metal particles were heat fused to form a source line including a source electrode and an input-output electrode including a drain electrode.

The thus obtained TFT (thin-film transistor) sheet, in which pixels are arranged in a matrix form, can be used as a display or a light sensor.

EXAMPLE 10

An organic thin-film transistor was prepared in the same manner as in Example 3, except that a MEK dispersion of gold particles with an average particle diameter of 10 nm, which was manufactured according to the metal particle dispersion manufacturing method described in Japanese Patent O.P.I. Publication No. 2000-239853, was used instead of the aqueous dispersion of gold particles. The resulting organic thin-film transistor exhibited a good FET property as in Example 3.

EXAMPLE 11

An organic thin-film transistor was prepared in the same manner as in Example 8, except that an aqueous dispersion of silver particles with an average particle diameter of 10 nm, which was manufactured according to the metal particle dispersion manufacturing method described in Japanese Patent O.P.I. Publication No. 11-80647, was used instead of the aqueous dispersion of gold particles. The resulting organic thin-film transistor exhibited a good FET property as in Example 3. Carrier mobility at saturation region of this transistor was 0.04 $cm^2/V \cdot sec$.

EXAMPLE 12

An organic thin-film transistor was prepared in the same manner as in Example 8, except that the organic semiconductor layer was changed to a 50 nm thick pentacene layer formed according to a vacuum deposition method. The resulting organic thin-film transistor exhibited good performance as a p-channel, enhancement type FET. Carrier mobility at saturation region of this transistor was 0.5 $cm^2/V \cdot sec$.

EXAMPLE 13

An organic thin-film transistor was prepared in the same manner as in Example 8, except that an aqueous dispersion of gold particles with an average particle diameter of 10 nm, which was manufactured according to the metal particle dispersion manufacturing method described in Japanese Patent O.P.I. Publication No. 11-80647, was coated on the organic semiconductor layer, and dried at 100° C. for 5 minutes to form a 0.1 μm thick gold particle dispersion layer, and then an aqueous dispersion of copper particles with an average particle diameter of 10 nm, which was manufactured according to the metal particle dispersion manufacturing method described in Japanese Patent O.P.I. Publication No. 11-80647, was coated on the resulting gold particle dispersion layer and dried at 100° C. for 5 minutes to form a 0.4 μm thick copper particle dispersion layer. The resulting organic thin-film transistor exhibited a good operation property as Example 8.

EXAMPLE 14

An organic thin-film transistor was prepared in the same manner as in Example 8, except that an aqueous dispersion (BAYTRON P, produced by Bayer Co., Ltd.) of PEDOT-PSS (polystyrene sulfonic acid) complex was coated on the organic semiconductor layer, and dried at 100° C. for 5 minutes in an atmosphere of nitrogen to form a 0.05 μm thick PEDOT-PSS complex layer, and then an aqueous dispersion of silver particles with an average particle diameter of 10 nm, which was manufactured according to the metal particle dispersion manufacturing method described in Japanese Patent O.P.I. Publication No. 11-80647, was coated on the resulting PEDOT-PSS complex layer and dried at 100° C. for 5 minutes in an atmosphere of nitrogen to form a 0.3 μm thick silver particle dispersion layer. Carrier mobility at saturation region of this transistor was 0.06 $cm^2/V \cdot sec$.

EXAMPLE 15

An organic thin-film transistor was prepared in the same manner as in Example 14, except that the organic semiconductor layer was changed to a 50 nm thick pentacene layer formed according to a vacuum deposition method. The resulting organic thin-film transistor exhibited good performance as a p-channel, enhancement type FET. Carrier mobility at saturation region of this transistor was 0.6 $cm^2/V \cdot sec$.

EXAMPLE 16

An aqueous dispersion of gold particles with an average particle diameter of 10 nm, which was manufactured according to the metal particle dispersion manufacturing method described in Japanese Patent O.P.I. Publication No. 11-80647, was coated on a 150 μm thick polyimide film to obtain a 0.1 μm thick gold particle layer. The photoresist used in Example 8 was provided on the gold particle layer, and exposed to laser. The photoresist layer at exposed portions was removed with an alkali solution, and washed with water to remove a gold particle dispersion layer at the portions at which the photoresist layer removed. Further, the residual photoresist was removed with THF. A PHT solution was coated on the resulting material and dried to form a 30 nm organic semiconductor layer. A polyvinyl phenol MEK solution was coated on the organic semiconductor layer, and dried to form a 300 nm thick gate insulation layer. Subsequently, an aqueous dispersion (BAYTRON P, produced by Bayer Co., Ltd.) of PEDOT-PSS (polystyrene sulfonic acid) complex was provided on the gate insulation layer employing an ink jet method, and dried to form a gate electrode. The gold particles in the gold particle layer of the resulting material were further heat-fused at 200° C. in an atmosphere of nitrogen to form a source-drain electrode. The resulting organic thin-film transistor exhibited good performance as a p-channel, enhancement type FET. Carrier mobility at saturation region of this transistor was 0.020 cm$^2$/V·sec.

In the above process, the heat-fusion can be carried out after the removal of the photoresist with THF.

EXAMPLE 17

An aqueous dispersion of gold particles with an average particle diameter of 10 nm, which was manufactured according to the metal particle dispersion manufacturing method described in Japanese Patent O.P.I. Publication No. 11-80647, was coated on a 150 μm thick polyimide film to obtain a 0.1 μm thick gold particle layer. An aqueous dispersion (BAYTRON P, produced by Bayer Co., Ltd.) of PEDOT-PSS (polystyrene sulfonic acid) complex was coated on the gold particle layer, and dried to form a 50 μm thick electrically conductive polymer layer. The photoresist used in Example 8 was provided on the electrically conductive polymer layer, and exposed to laser. The photoresist layer at exposed portions was removed with an alkali solution, and washed with water to remove a gold particle dispersion layer at the portions at which the photoresist layer removed. Further, the residual photoresist was removed with THF. A PHT solution was coated on the resulting material and dried to form a 30 nm organic semiconductor layer. A polyvinyl phenol MEK solution was coated on the organic semiconductor layer, and dried to form a 300 nm thick gate insulation layer. The gold particles in the gold particle layer of the resulting material were further heat-fused at 200° C. in an atmosphere of nitrogen to form a source-drain electrode. Thus, an organic thin-film transistor was obtained. Carrier mobility at saturation region of this transistor was 0.020 cm$^2$/V·sec.

In the above process, the heat-fusion can be carried out after the removal of the photoresist with THF.

EFFECT OF THE INVENTION

The present invention can provide a method of manufacturing an organic thin-film transistor with stable performance through roll to roll and provide a device such as a display or a sensor, which is low in price and high in performance.

What is claimed is:

1. A method for manufacturing an organic thin-film transistor comprising a substrate, a gate electrode, a gate insulation layer, an organic semiconductor layer, a source electrode and a drain electrode, wherein the method comprises the steps of:

forming the gate electrode on the substrate;
forming the gate insulation layer on the substrate;
forming the organic semiconductor layer on the substrate;
applying a metal particle dispersion containing metal particles having an average particle diameter of not more than 100 nm on the substrate, gate insulation layer, or organic semiconductor layer to form an electrode precursor layer comprised of the metal particles; and
heat-fusing the metal particles in the electrode precursor layer at 50 to 350° C. to form the source electrode and the drain electrode.

2. The method of claim 1, wherein the metal particle dispersion containing metal particles is applied in an electrode pattern to form an electrode-shaped precursor layer comprised of the metal particles.

3. The method of claim 2, wherein the metal particle dispersion containing metal particles is applied in an electrode pattern according to a method selected from the group consisting of a printing method, an ink jet method, an ablation method, a lift-off method, a squeegee method, and photolithography.

4. The method of claim 3, wherein the photolithography comprises the steps of forming an electrode precursor layer comprised of metal particles on the gate insulation layer, forming a photoresist layer on the precursor layer, exposing the photoresist layer, and developing the exposed photoresist layer to leave the electrode-shaped precursor layer.

5. The method of claim 1, wherein the metal particle dispersion is an aqueous metal particle dispersion.

6. The method of claim 1, wherein the metal particles of the electrode precursor layer have an average particle diameter of not more than 50 nm.

7. The method of claim 1, wherein the heat-fusing is carried out at 100 to 300° C.

8. The method of claim 1, wherein the heat fusing is carried out employing a thermal head.

9. The method of claim 1, wherein the heat fusing is carried out employing light-heat conversion.

10. The method of claim 9, wherein the light-heat conversion is carried out employing a high luminance light.

11. The method of claim 10, wherein the high luminance light is a laser.

12. The method of claim 9, wherein the light-heat conversion is carried out through a light-heat conversion layer.

13. The method of claim 1, wherein the metal particle dispersion applying step comprises applying two metal particle dispersions, one metal particle dispersion of the two containing first metal particles and the other containing second metal particles different from the first metal particles.

14. The method of claim 1, further comprising the step of applying a dispersion containing an electrically conductive polymer on the semiconductor layer to form an electrically conductive polymer layer, wherein the electrode precursor layer is formed onto the resulting polymer layer.

* * * * *